US010818582B2

(12) United States Patent
Villamor et al.

(10) Patent No.: US 10,818,582 B2
(45) Date of Patent: Oct. 27, 2020

(54) PACKAGED SEMICONDUCTOR DEVICES WITH LASER GROOVED WETTABLE FLANK AND METHODS OF MANUFACTURE

(71) Applicant: FAIRCHILD SEMICONDUCTOR CORPORATION, Phoenix, AZ (US)

(72) Inventors: Aira Lourdes Villamor, Lapu-Lapu (PH); Erwin Victor Cruz, Koronadal (PH); Geraldine Suico, Consolacion (PH); Silnore Sabando, Lapu-Lapu (PH)

(73) Assignee: FAIRCHILD SEMICONDUCTOR CORPORATION, Phoenix, AZ (US)

( * ) Notice: Subject to any disclaimer, the term of this patent is extended or adjusted under 35 U.S.C. 154(b) by 0 days.

(21) Appl. No.: 16/680,649

(22) Filed: Nov. 12, 2019

(65) Prior Publication Data
US 2020/0083148 A1 Mar. 12, 2020

Related U.S. Application Data

(63) Continuation of application No. 15/982,616, filed on May 17, 2018, now Pat. No. 10,483,192, which is a
(Continued)

(51) Int. Cl.
*H01L 23/49* (2006.01)
*H01L 23/495* (2006.01)
(Continued)

(52) U.S. Cl.
CPC .... *H01L 23/49544* (2013.01); *H01L 21/4821* (2013.01); *H01L 21/4842* (2013.01);
(Continued)

(58) Field of Classification Search
CPC ......... H01L 23/49544; H01L 23/49548; H01L 23/49582; H01L 21/561; H01L 21/4821;
(Continued)

(56) References Cited

U.S. PATENT DOCUMENTS 6,608,366 B1 8/2003 Fogelson et al.
2005/0029640 A1 2/2005 Amano et al.
(Continued)

OTHER PUBLICATIONS

"TN 1236 Technical Note, Leadless Packges with Enhanced Board Level Solder Joint Reliability for Automotive Application", ST Life.augmented, Jun. 2016.
(Continued)

*Primary Examiner* — Matthew L Reames
(74) *Attorney, Agent, or Firm* — Brake Hughes Bellermann LLP

(57) ABSTRACT

In a general aspect, a method for producing a packaged semiconductor device can include coupling a semiconductor device to a leadframe structure having a signal lead that is electrically coupled with the semiconductor device. The method can also include forming, with a laser, a groove in the signal lead, the groove having a first sidewall and a second sidewall, and applying solder plating to the signal lead, including the first sidewall and the second sidewall of the groove. The method can further include separating, at the groove, the signal lead into a first portion and a second portion, such that the second portion of the signal lead is separated from the metal leadframe structure.

20 Claims, 12 Drawing Sheets

Related U.S. Application Data continuation of application No. 15/407,918, filed on Jan. 17, 2017, now Pat. No. 9,978,668.

(51) Int. Cl.
| | | |
|---|---|---|
| *H01L 23/492* | (2006.01) | |
| *H01L 21/56* | (2006.01) | |
| *H01L 21/48* | (2006.01) | |
| *H01L 23/31* | (2006.01) | |

(52) U.S. Cl.
CPC ........ *H01L 21/561* (2013.01); *H01L 23/3157* (2013.01); *H01L 23/492* (2013.01); *H01L 23/4952* (2013.01); *H01L 23/49548* (2013.01); *H01L 23/49575* (2013.01); *H01L 23/49582* (2013.01); *H01L 23/3107* (2013.01)

(58) Field of Classification Search
CPC ............. H01L 21/4842; H01L 23/3157; H01L 23/4952; H01L 23/49575; H01L 23/492; H01L 23/3107

See application file for complete search history.

(56) References Cited

U.S. PATENT DOCUMENTS

| | | |
|---|---|---|
| 2006/0043566 A1 | 3/2006 | Nakanishi |
| 2010/0133693 A1 | 6/2010 | Arshad |
| 2011/0244629 A1 | 10/2011 | Gong et al. |
| 2012/0292755 A1 | 11/2012 | Wang |
| 2015/0076675 A1 | 3/2015 | Real et al. |

OTHER PUBLICATIONS

Bradley Smith, Allegro MicroSystems, LLC, "Application Information Wettable Flank Plated PQFN", AN269119, Jan. 13, 2015.
U.S. Appl. No. 15/407,918, filed Jan. 17, 2017, Granted.
U.S. Appl. No. 15/982,616, filed May 17, 2018, Pending.

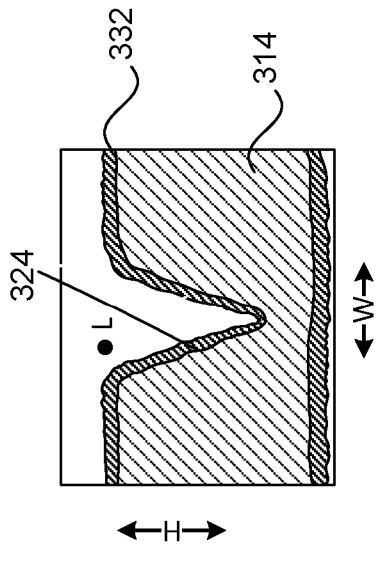
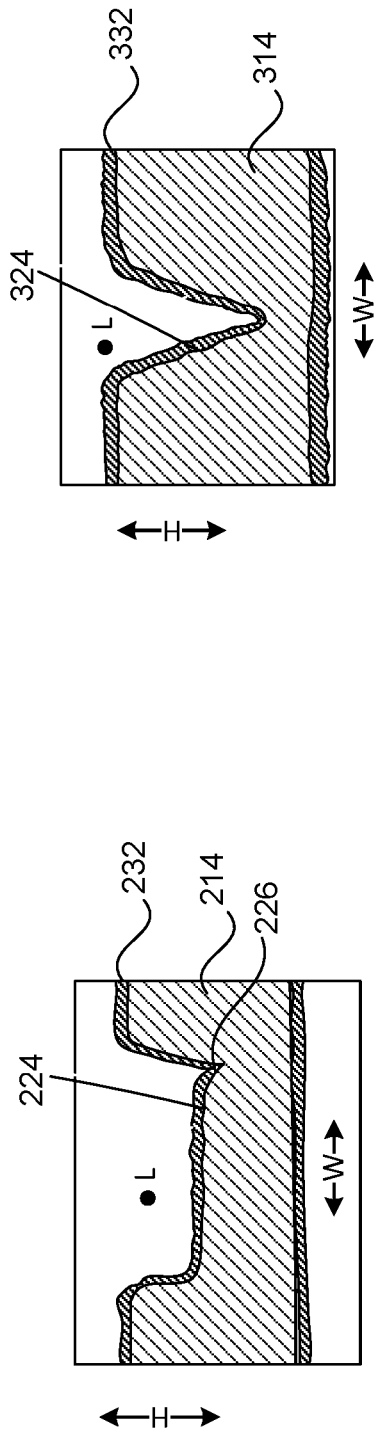
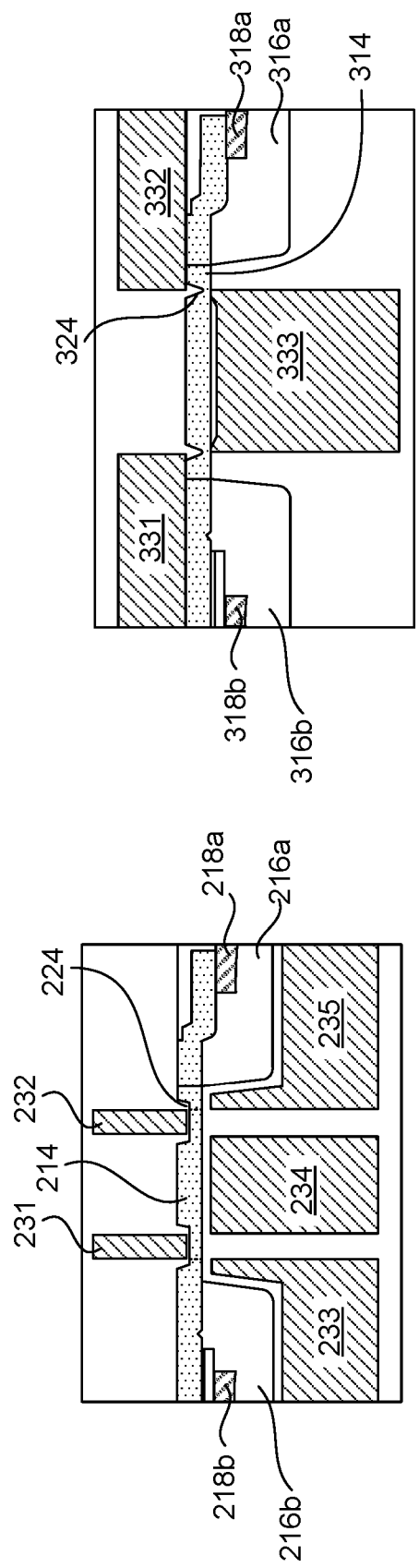
FIG. 3A
FIG. 3B
FIG. 2A
FIG. 2B

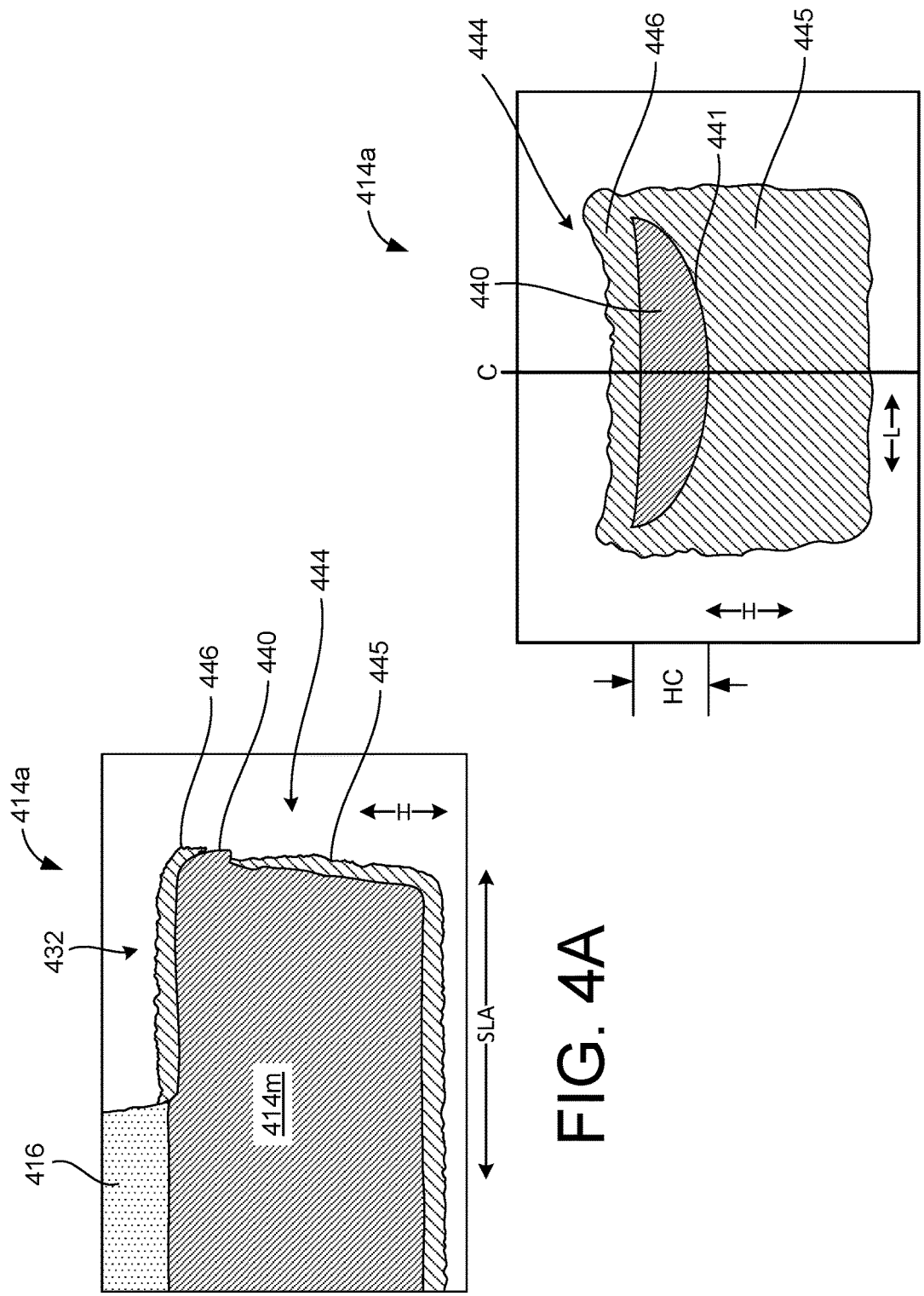

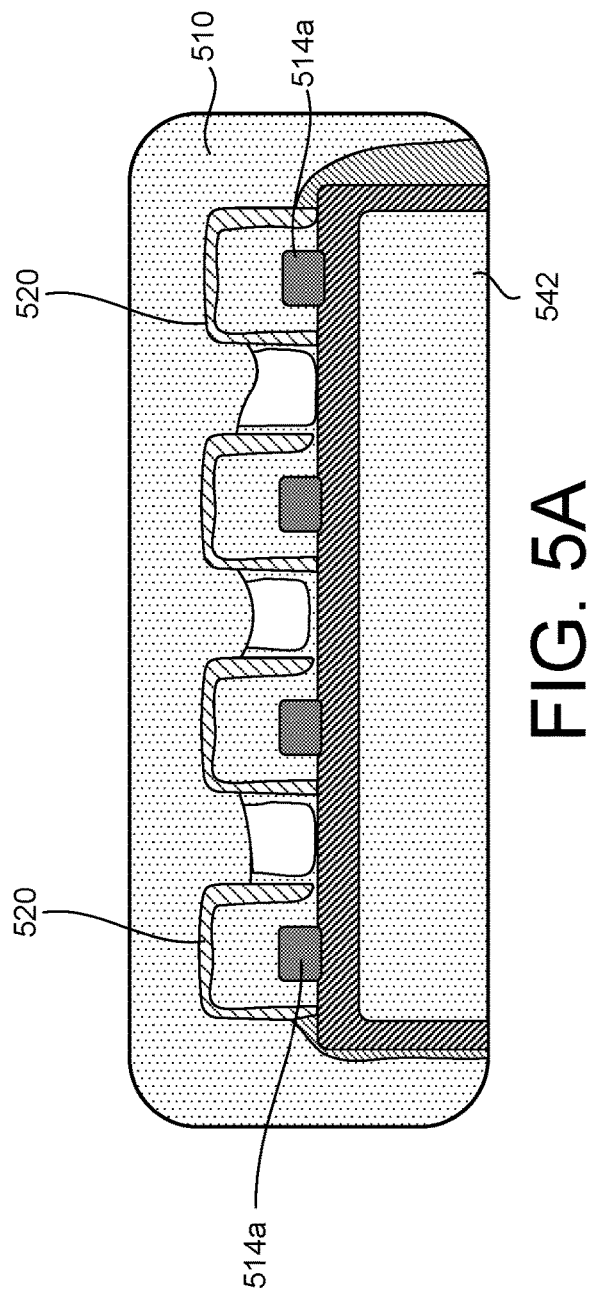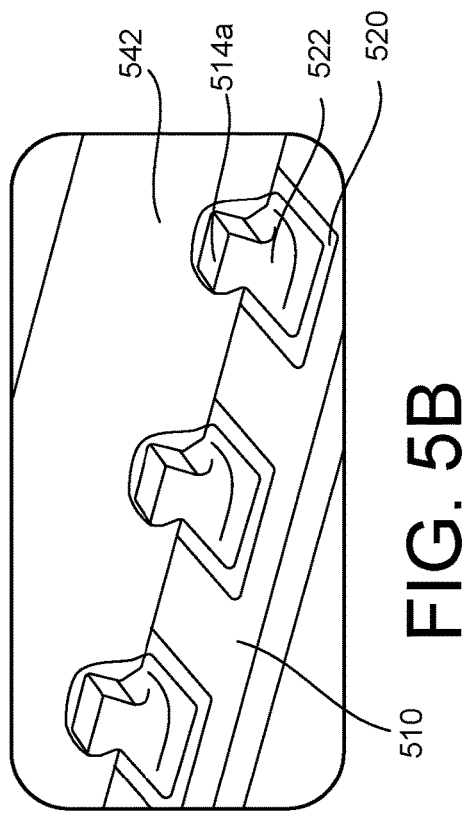

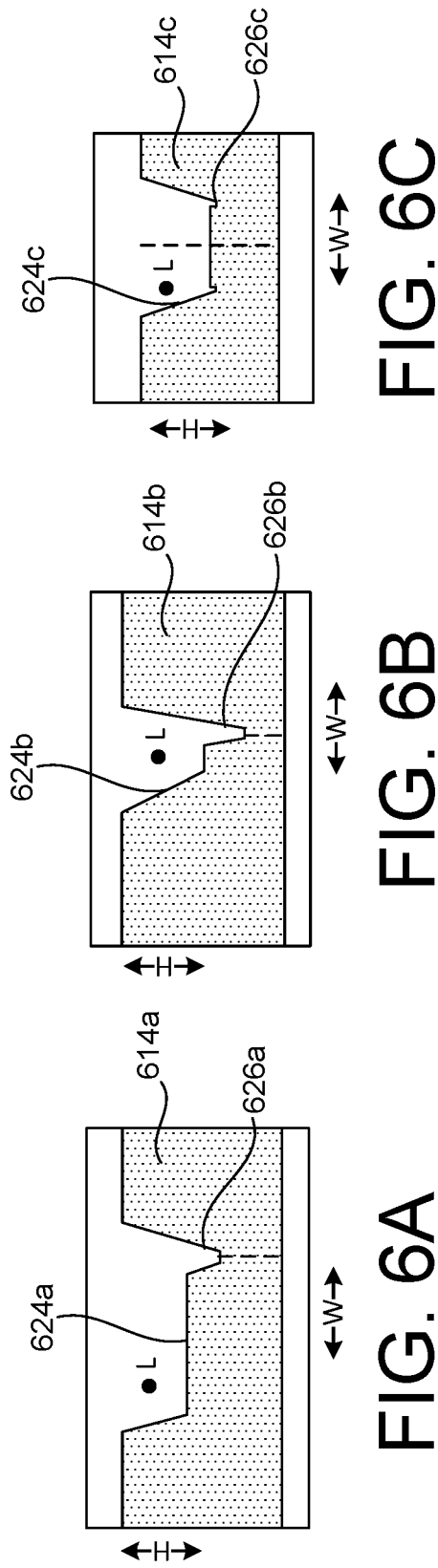

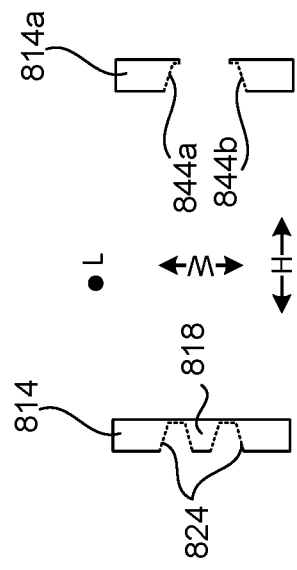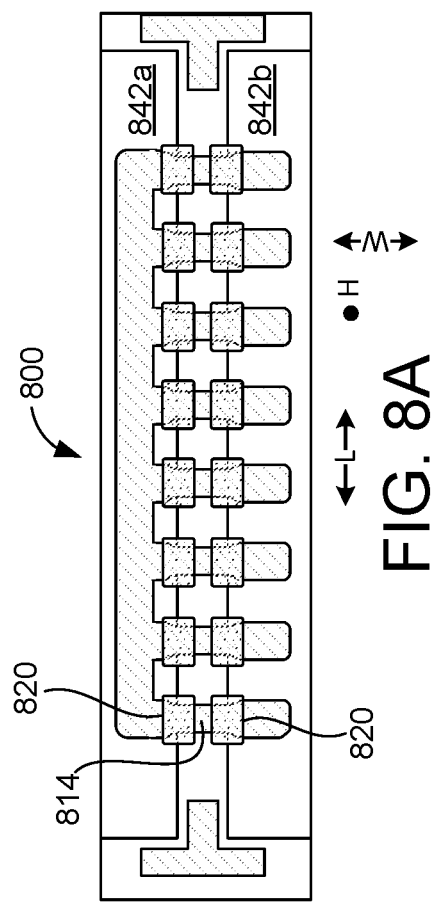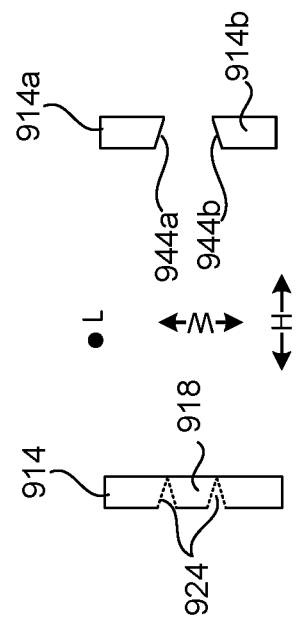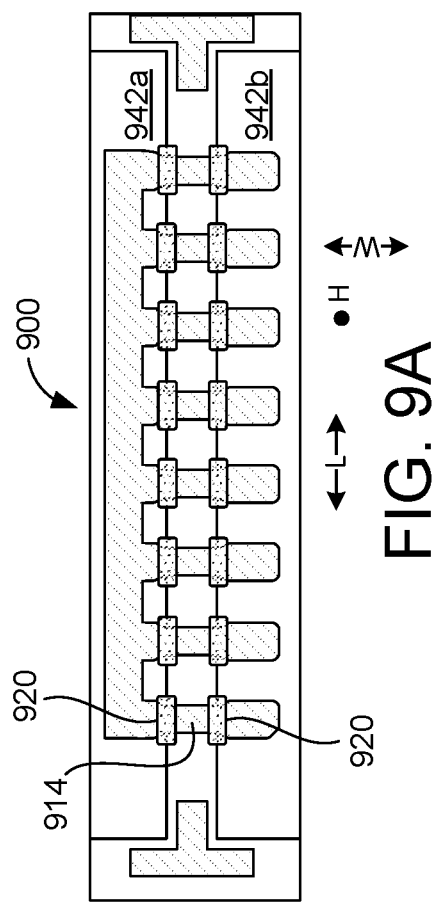
FIG. 8A  FIG. 8B  FIG. 8C
FIG. 9A  FIG. 9B  FIG. 9C

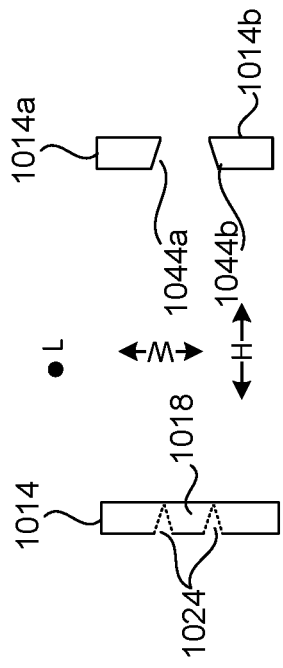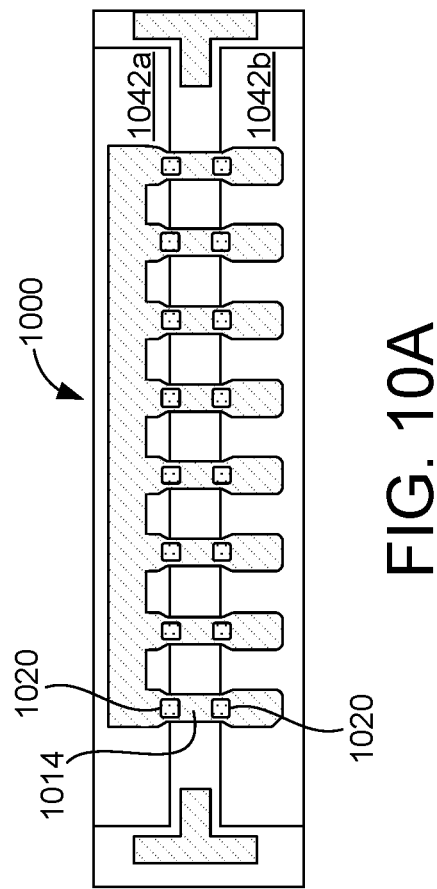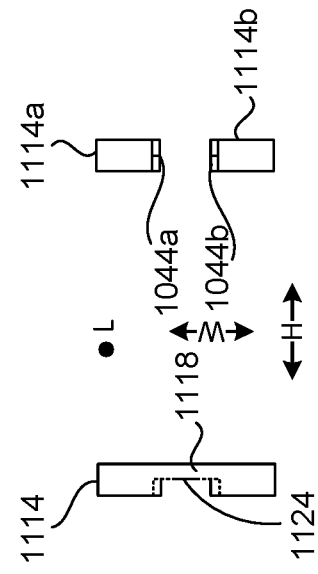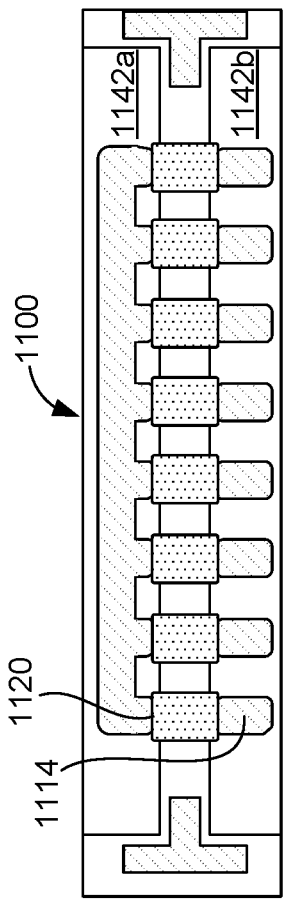
FIG. 10A  FIG. 10B  FIG. 10C
FIG. 11A  FIG. 11B  FIG. 11C

PACKAGED SEMICONDUCTOR DEVICES WITH LASER GROOVED WETTABLE FLANK AND METHODS OF MANUFACTURE

CROSS-REFERENCE TO RELATED APPLICATIONS

This application is a continuation of U.S. patent application Ser. No. 15/982,616, filed May 17, 2018, titled "PACKAGED SEMICONDUCTOR DEVICES WITH LASER GROOVED WETTABLE FLANK AND METHODS OF MANUFACTURE," which is a continuation of U.S. patent application Ser. No. 15/407,918, filed Jan. 17, 2017, titled "PACKAGED SEMICONDUCTOR DEVICES WITH LASER GROOVED WETTABLE FLANK AND METHODS OF MANUFACTURE," both disclosures of which are hereby incorporated by reference in their entireties.

TECHNICAL FIELD

This description relates to packaged semiconductor devices. More specifically, this description relates to packaged semiconductor device with signal leads having wettable (e.g., solder wettable) flanks and processes for producing such packaged semiconductor devices.

SUMMARY

In a general aspect, a packaged semiconductor device (device) can include a semiconductor device and a metal leadframe structure. The metal leadframe structure can have a signal lead that is electrically coupled with the semiconductor device. The device can also include a molding compound encapsulating at least a portion of the semiconductor device and at least a portion of the metal leadframe structure. At least a portion of the signal lead can be exposed outside the molding compound. The molding compound can define a primary plane of the apparatus. The device can further include a solder plating disposed on exposed portions of the metal leadframe structure. A flank of the signal lead can have a surface area. A first portion of the surface area of the flank of the signal lead can be defined by the solder plating. A second portion of the surface area of the flank of the signal lead can be defined by exposed metal of the metal leadframe structure. A center portion of the surface of the exposed metal can have a height along an axis that is approximately orthogonal with the primary plane of the apparatus. The height of the center portion can be greater than a height, along the axis that is approximately orthogonal with the primary plane of the apparatus, of a portion of the surface of the exposed metal that is laterally disposed from the center portion of the surface of the exposed metal.

Implementations can include one or more of the following features. For example, a perimeter of the surface of the exposed metal can have at least one curved edge. A perimeter of the surface of the exposed metal can be semicircle shaped. The surface of the exposed metal can be surrounded by the solder plating.

In another general aspect, a packaged semiconductor device (device) can include a semiconductor device and a metal leadframe structure. The metal leadframe structure can have a signal lead that is electrically coupled with the semiconductor device. The device can also include a molding compound encapsulating at least a portion of the semiconductor device and at least a portion of the metal leadframe structure. At least a portion of the signal lead can be exposed outside the molding compound. The device can further include a solder plating disposed on exposed portions of the metal leadframe structure. In the device, a flank of the signal lead can have a surface area. At least 75% of the surface area of the flank of the signal lead can be defined by the solder plating, and 25% or less of the surface area of the flank of the signal lead can be defined by exposed metal of the metal leadframe structure. A perimeter of a surface of the exposed metal can have at least one curved edge.

Implementations can include one or more of the following features. For example, the flank of the signal lead can be disposed at an end of the signal lead. The surface area of the flank can have a first portion and a second portion. The first portion can be defined by a laser groove and the second portion can be defined by a cleave in the metal leadframe structure. The surface of the exposed metal can be included in the second portion.

The flank of the signal lead can be disposed at an end of the signal lead. The surface area of the flank can have a first portion and a second portion. The first portion can be defined by a laser groove. The second portion can be defined by a saw cut in the metal leadframe structure. The surface of the exposed metal can be included in the second portion.

The molding compound can define a primary plane of the apparatus, a center portion of the cross-sectional profile of the surface of the exposed metal having a height along an axis that is approximately orthogonal to the primary plane of the apparatus, the height of the center portion being greater than a height of a portion of the cross-sectional profile of the surface of the exposed metal that is laterally disposed from the center portion.

The perimeter of the surface of the exposed metal can be crescent shaped. The perimeter of the surface of the exposed metal is semicircle shaped.

The portion of the signal lead that is exposed outside the molding compound can extend away from a surface of the molding compound, such that the flank of the signal lead is spaced a distance from the surface of the molding compound. The flank of the signal lead can be substantially coplanar with a surface of the molding compound.

In another general aspect, a method for producing a packaged semiconductor device can include providing an encapsulated semiconductor device including a semiconductor die, a molding compound and a metal leadframe structure. The metal leadframe structure can include a signal lead segment. The signal lead segment can be electrically coupled with the semiconductor die. The method can also include forming, with a laser, a groove in the signal lead segment and solder plating, including the groove, the signal lead segment. The method can further include separating, at the groove, a first portion of the signal lead segment from a second portion of the signal lead segment.

Implementations can include one or more of the following features. For example separating the first portion of the signal lead segment from the second portion of the signal lead segment can include performing a saw singulation of the encapsulated semiconductor device. Separating the first portion of the signal lead segment from the second portion of the signal lead segment can include performing a punch singulation of the encapsulated semiconductor device.

Forming the groove in the signal lead segment can include forming a symmetric groove. Forming the groove in the signal lead segment can include forming an asymmetric groove.

Separating the first portion of the signal lead segment from the second portion of the signal lead segment can expose metal of the metal leadframe structure through the solder plating.

The encapsulated semiconductor device can be included in a panel of a plurality of encapsulated semiconductor devices formed using a single molding cavity. The encapsulated semiconductor device can be included in a matrix of a plurality of encapsulated semiconductor devices formed using a plurality of respective molding cavities.

In yet another general aspect, an apparatus can include a semiconductor device and a metal leadframe structure having a signal lead that is electrically coupled with the semiconductor device. The apparatus can include a molding compound encapsulating at least a portion of the semiconductor device and at least a portion of the metal leadframe structure. At least a portion of the signal lead can be exposed outside the molding compound. The apparatus can include a solder plating disposed on exposed portions of the metal leadframe structure and a flank of the signal lead having a surface area. At least 75% of the surface area of the flank of the signal lead can be defined by the solder plating, and 25% or less of the surface area of the flank of the signal lead can be defined by exposed metal of the metal leadframe structure. The surface area of the flank can be a discontinuous surface area. A perimeter of a surface of the exposed metal can be crescent shape or semicircular shaped. A center portion of the surface of the exposed metal can have a height along an axis that is approximately orthogonal with a primary plane of the apparatus. The primary plane of the apparatus can be defined by the molding compound. The height of the center portion can be greater than a height, along the axis that is approximately orthogonal with the primary plane of the apparatus, of a portion of the surface of the exposed metal that is laterally disposed from the center portion of the surface of the exposed metal.

In some implementations, the flank of the signal lead can be disposed at an end of the signal lead. The discontinuous surface area of the flank can include a first portion and a second portion. The first portion can be defined by a laser groove and the second portion can be defined by a cleave in the metal leadframe structure. The surface of the exposed metal can be included in the second portion. In some implementations, the discontinuous surface area of the flank can further include a third portion disposed between the first portion of the discontinuous surface area of the flank and the second portion of the discontinuous surface area of the flank.

In some implementations, the flank of the signal lead can be disposed at an end of the signal lead, the discontinuous surface area of the flank has a first portion and a second portion, and the first portion can be defined by a laser groove. The second portion can be defined by a saw cut in the metal leadframe structure and the surface of the exposed metal can be included in the second portion. In some implementations, the discontinuous surface area of the flank can further include a third portion disposed between the first portion of the discontinuous surface area of the flank and the second portion of the discontinuous surface area of the flank.

In some implementations, the portion of the signal lead that is exposed outside the molding compound can extend away from a surface of the molding compound, such that the flank of the signal lead is spaced a distance from the surface of the molding compound.

In some implementations, the flank of the signal lead can be substantially coplanar with a surface of the molding compound.

In some implementations, the surface of the exposed metal can be surrounded by the solder plating.

BRIEF DESCRIPTION OF THE DRAWINGS

FIG. 2A is a diagram illustrating a laser grooved signal lead segment, according to an implementation.

FIG. 2B is a diagram illustrating a singulation process for the signal lead segment of FIG. 2A, according to an implementation.

FIG. 3A is a diagram illustrating another laser grooved signal lead segment, according to an implementation.

FIG. 3B is a diagram illustrating a singulation process for the signal lead segment of FIG. 3A, according to an implementation.

FIG. 4A is a diagram illustrating a cross-sectional view of a packaged semiconductor device and corresponding signal lead produced using the method of FIG. 1, according to an implementation.

FIG. 4B is a diagram illustrating a wettable flank of the signal lead of FIG. 4A.

FIG. 5A is a diagram illustrating a plan view of a packaged semiconductor device produced using the method of FIG. 1 after solder mounting on a printed circuit board (PCB), according to an implementation.

FIG. 5B is a diagram illustrating a magnified perspective view of the packaged semiconductor device and PCB of FIG. 5A.

FIGS. 6A-6E are diagrams illustrating profiles of various laser grooves in signal leads of packaged semiconductor devices, according to respective implementations.

FIG. 8A is a diagram illustrating a partial plan view of laser groove pattern for adjacent packaged semiconductor devices assembled in panel form, according to an implementation.

FIG. 8B is a diagram schematically illustrating a cross-sectional view of signal lead laser grooves according to the laser groove pattern of FIG. 8A, prior to singulation of the adjacent packaged semiconductor devices.

FIG. 8C is a diagram schematically illustrating a cross-sectional view of signal leads of the adjacent packaged semiconductor devices of FIG. 8A after laser grooving, as illustrated by FIG. 8B, and singulation.

FIG. 9A is a diagram illustrating a partial plan view of laser groove pattern for adjacent packaged semiconductor devices assembled in panel form, according to an implementation.

FIG. 9B is a diagram schematically illustrating a cross-sectional view of signal lead laser grooves according to the laser groove pattern of FIG. 9A, prior to singulation of the adjacent packaged semiconductor devices.

FIG. 9C is a diagram schematically illustrating a cross-sectional view of signal leads of the adjacent packaged semiconductor devices of FIG. 9A after laser grooving, as illustrated by FIG. 9B, and singulation.

FIG. 10A is a diagram illustrating a partial plan view of laser groove pattern for adjacent packaged semiconductor devices assembled in panel form, according to an implementation.

FIG. 10B is a diagram schematically illustrating a cross-sectional view of signal lead laser grooves according to the laser groove pattern of FIG. 10A, prior to singulation of the adjacent packaged semiconductor devices.

FIG. 10C is a diagram schematically illustrating a cross-sectional view of signal leads of the adjacent packaged semiconductor devices of FIG. 10A after laser grooving, as illustrated by FIG. 10B, and singulation.

FIG. 11A is a diagram illustrating a partial plan view of laser groove and molding compound ablation pattern for adjacent packaged semiconductor devices assembled in panel form, according to an implementation.

FIG. 11B is a diagram schematically illustrating a cross-sectional view of signal lead laser grooves according to the laser groove and molding compound ablation pattern of FIG. 11A, prior to singulation of the adjacent packaged semiconductor devices.

FIG. 11C is a diagram schematically illustrating a cross-sectional view of signal leads of the adjacent packaged semiconductor devices of FIG. 11A after laser grooving and molding compound ablation, as illustrated by FIG. 11B, and singulation.

Figure 1A:
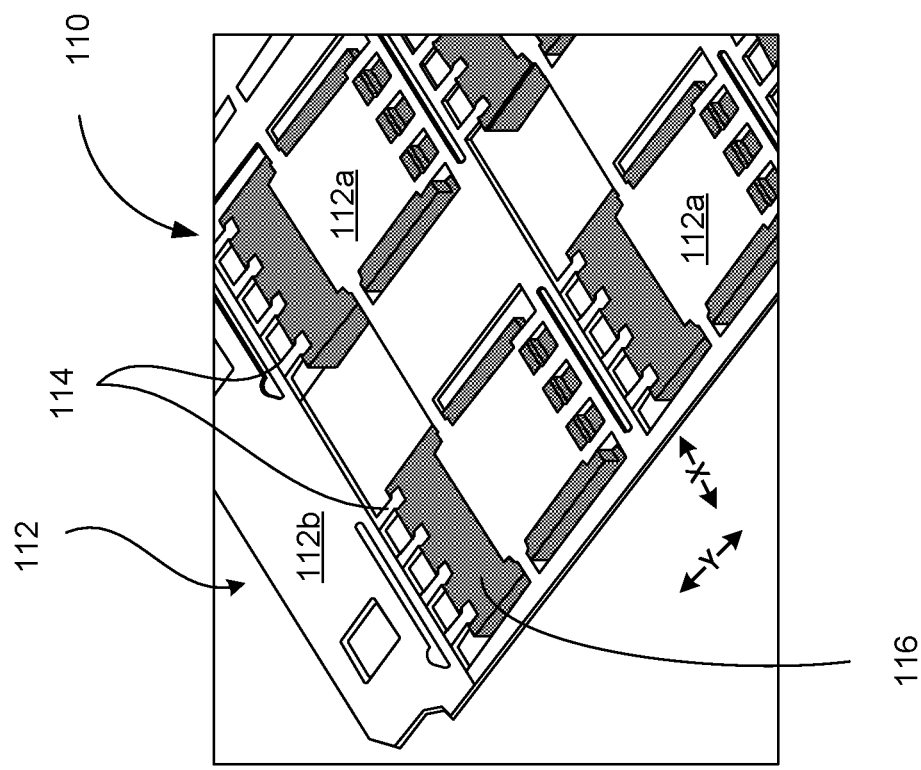
FIGS. 1A-1D are diagrams illustrating a manufacturing process flow for producing packaged semiconductor devices with wettable signal lead flanks using laser grooving, according to an implementation.

In the drawings, like reference symbols in the various drawings indicate like elements. Reference numbers for some like elements may not be repeated for all such elements. In certain instances, different reference numbers may be used for like elements, or similar elements. Some reference numbers for certain elements of a given implementation may not be repeated in each drawing corresponding with that implementation. Some reference numbers for certain elements of a given implementation may be repeated in other drawings corresponding with that implementation, but may not be specially discussed with reference to each corresponding drawing.

DETAILED DESCRIPTION

This disclosure relates to various packaged semiconductor device apparatus and associated methods for manufacturing such packaged semiconductor devices. The approaches illustrated and described herein can be used to produce a number of different packaged semiconductor devices. The approaches described herein are directed to packaged semiconductor devices with wettable (solder wettable, solder plated, etc.) signal lead flanks, where a given signal lead flank is disposed at an end of a respective signal lead of a metal leadframe structure of the packaged semiconductor device and is defined along an axis that is offset (e.g., at an angle to, orthogonal to, nearly orthogonal to, etc.) to a longitudinal axis defined by a corresponding signal lead, such as in the arrangements shown in FIGS. 1D and 4A and described below.

Figure 1B:
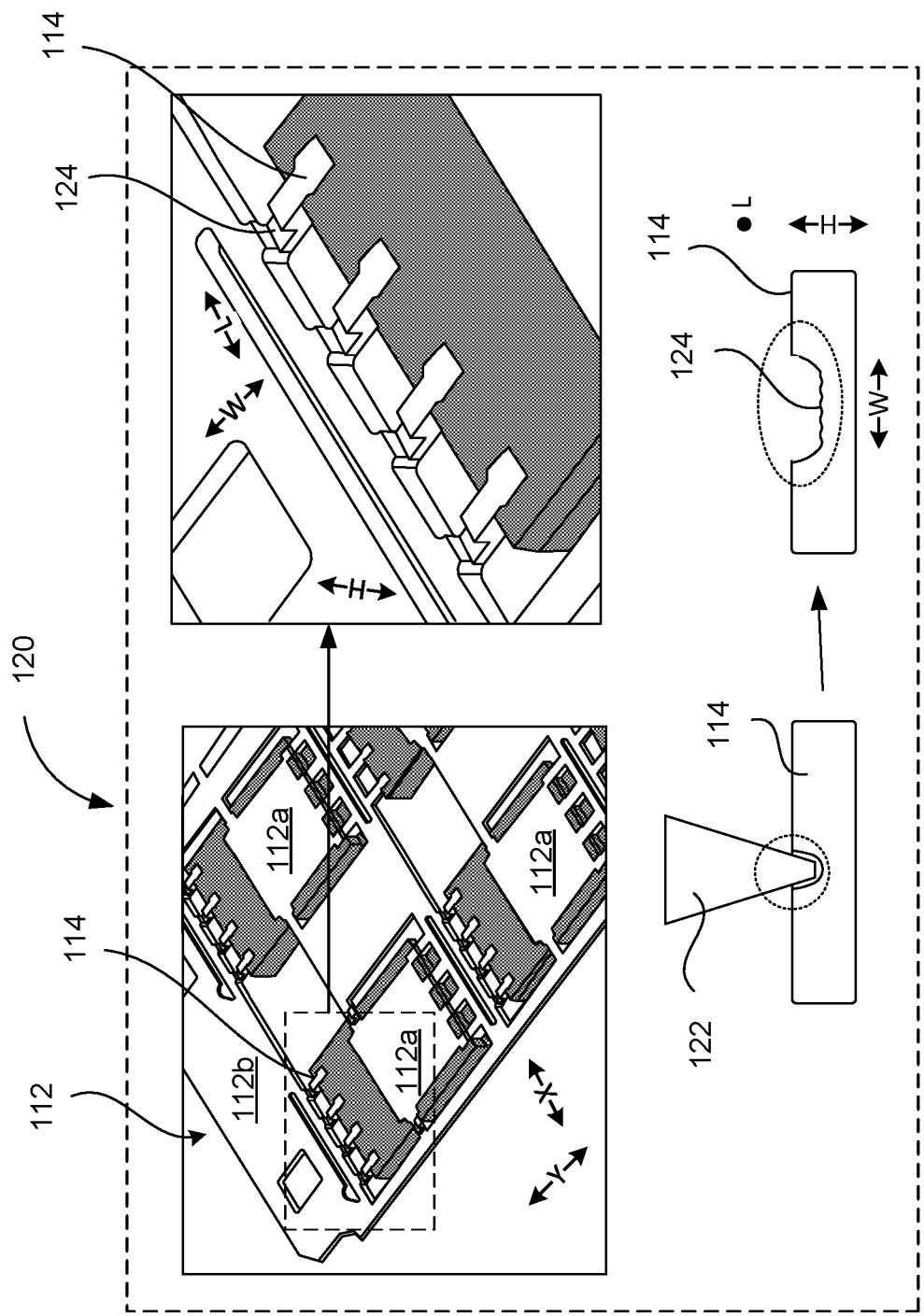
Figure 1C:
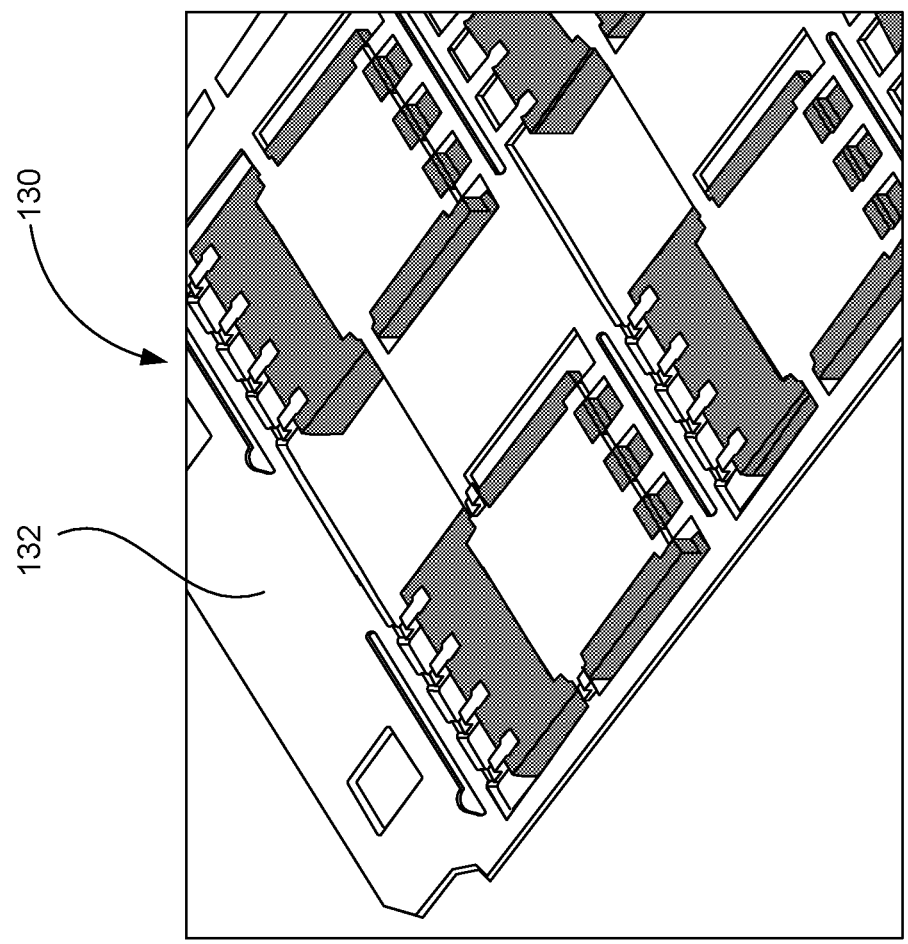
Figure 1D:
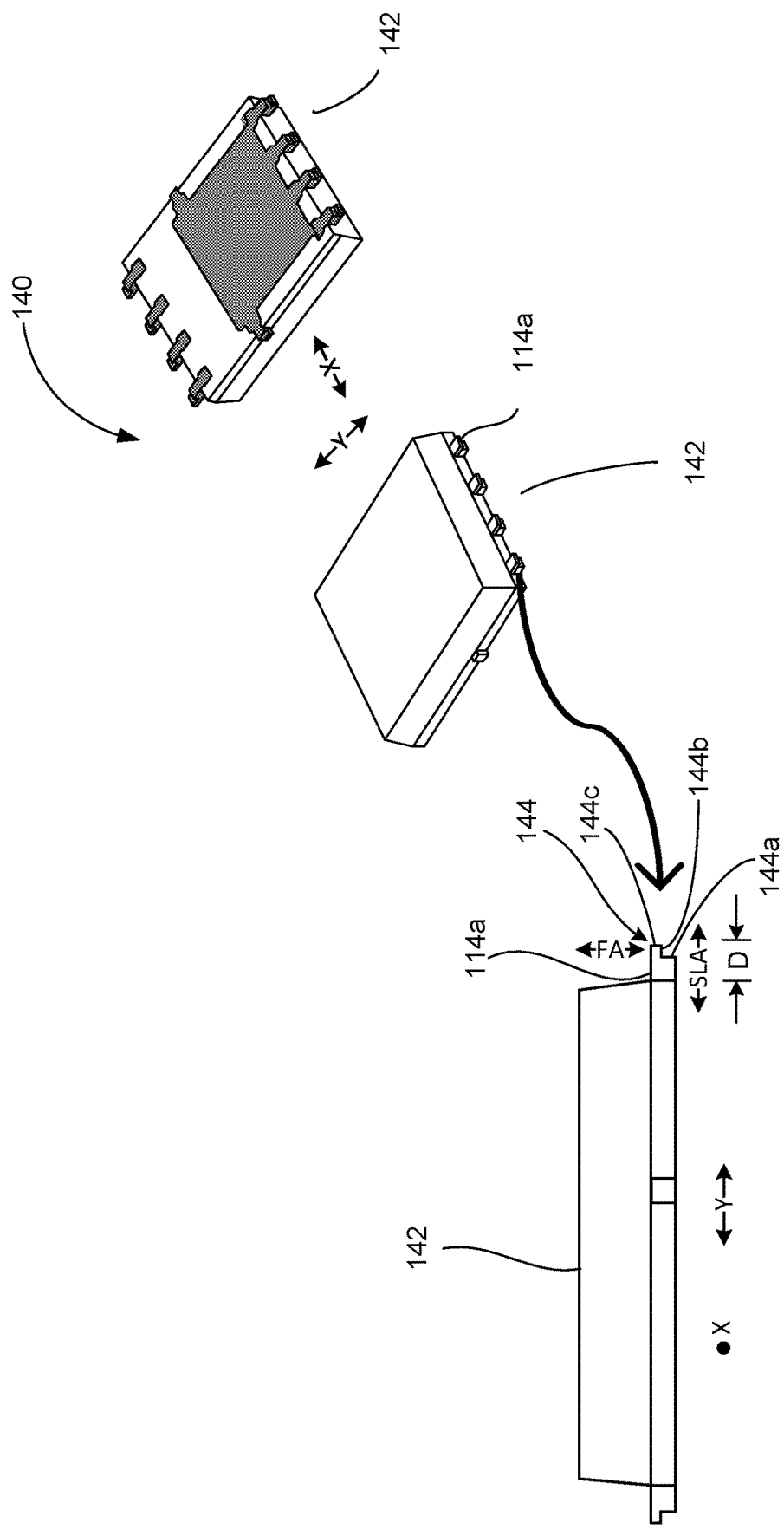

A solder wettable signal lead flank, in the examples described herein, can have a continuous surface (e.g., a substantially continuous surface, such as shown in FIG. 4A) or a discontinuous surface (e.g., such as shown in FIG. 1D). As described herein, such solder wettable solder flanks can have a surface (continuous or discontinuous) that has a first portion that is defined by solder plating formed on surfaces of a laser groove defined in a signal lead segment from which a signal lead is defined. The surface (continuous or discontinuous) of a solder wettable flank can also have a second portion that is defined by exposed metal (e.g., of a metal leadframe structure). Solder wettable signal lead flanks, such as those described herein, compared with current approaches, can improve the quality of solder joints formed between corresponding signal leads and electrical contact pads, such as electrical contact pads included on a printed circuit board.

Such wettable signal lead flanks can be defined, at least in part, by laser grooving a corresponding portion of a metal leadframe structure (e.g., a signal lead segment, a tie bar, etc.) prior to solder plating the leadframe structure and subsequent singulation of a corresponding packaged semiconductor device (e.g., from a leadframe matrix or panel assembly). Leadframe structures including signal lead segments (e.g., signal lead segments used to define packaged semiconductor signal leads) can be formed from copper, or formed from other electrically conductive metal materials, such as copper alloys, or other metals.

Use of such laser grooving to achieve solder wettable signal lead flanks for packaged semiconductor devices is not used in current packaged semiconductor device manufacturing processes. In contrast, current approaches may include etching of signal lead segments (e.g., during production of an associated leadframe matrix, leadframe strip, etc.) or stamping operations performed on signal lead segments. The use of laser grooving for producing solder wettable signal lead flanks may be advantageous over such current approaches, as approaches using laser grooving provides flexibility of shape and dimensions of a laser formed groove. For instance, the shape and dimensions of a given laser formed groove can depend on desired plating coverage of corresponding signal leads and/or a singulation method to be used for packaged device singulation. Also, configurations of such laser formed grooves (e.g., that are formed as part of a packaged device assembly process flow) can be modified without having to make changes to leadframe (e.g., matrix, strip, panel, etc.) designs, or changes leadframe manufacturing or device singulation tools, which can be costly. Accordingly, use of the approaches described herein can result in overall reduced manufacturing costs for devices manufactured.

Singulation of packaged semiconductor devices (e.g., after laser grooving and solder plating) can be performed to separate (singulate, and so forth) individual packaged semiconductor devices (e.g., including semiconductor die, multichip modules, etc.) from one or more other packaged semiconductor devices. For instance, punch-type singulation can be used to separate individual packaged semiconductor devices from one or more other packaged semiconductor devices that are produced using a leadframe matrix that includes a plurality of device leadframe structures, or a strip of a plurality of leadframe structures, where separate, respective molding cavities can be used for encapsulating (e.g., using an epoxy molding compound) each separate packaged semiconductor device (or module). In other approaches, saw singulation can be used to separate individual packaged semiconductor devices from one or more other packaged semiconductor devices that are produced in panel form (e.g., using a single molding cavity for a plurality of separate devices). In still other approaches, other singulation techniques can be used.

FIGS. 1A-1D are diagrams illustrating a manufacturing process flow for producing packaged semiconductor devices with wettable (e.g., solder wettable, etc.) signal lead flanks 144 using laser grooving, according to an implementation. The process flow, as shown in FIGS. 1A-1D, includes operations 110, 120, 130 and 140. Each of the operations 110-140 is illustrated using one or more diagrams. Each of these diagrams is described below with respect to their corresponding operation of the illustrated process flow. In FIGS. 1A-1D, while the example process flow is illustrated with respect to processing of packaged semiconductor devices that are produced using a leadframe matrix 112, a number of the operations of the illustrated process flow can be similarly used to manufacture packaged semiconductor devices that are produced in panel form.

As shown in FIG. 1A, operation 110 of the example process flow can include providing a plurality of encapsulated semiconductor devices on a metal (e.g., copper) leadframe matrix 112. The leadframe matrix 112 can include a plurality of leadframe structures 112a for each of a plurality of individual packaged devices, as well as a support structure (e.g., a support frame) 112b that is used to support the respective leadframe structures 112a of the individual packaged device during an assembly manufacturing process, such as the process flow of FIGS. 1A-1D. Each encapsulated semiconductor device can include a semiconductor die, multiple semiconductor die and/or other electronic components, such as passive devices (e.g., resistors, capacitors, inductors, etc.), which are not specifically shown in FIGS. 1A-1D. Separate molding cavities can be used to encapsulate the individual packaged devices in a molding compound 116 on the leadframe matrix 112, such as in the arrangement shown in operations 110, 120 and 130 of FIGS. 1A, 1B and 1C, which illustrates a section view of four packaged semiconductor devices arranged in the leadframe matrix 112.

As illustrated at operation 110 of FIG. 1A, each leadframe structure 112a can include a plurality of signal lead segments 114, where each signal lead segment 114 can be used to produce one or more separate signal leads. For example, depending on the particular implementation, a signal lead segment 114 can be used to define a single signal lead for a corresponding packaged semiconductor device. In some implementations, a signal lead segment 114 can be used to define a first signal lead for a first packaged semiconductor device and a second signal lead for a second packaged semiconductor device, e.g., where the first packaged semiconductor device is adjacent to the second packaged semiconductor device, where the adjacent devices can be next to each other along an X axis of the leadframe matrix 112 or along a Y axis of the leadframe matrix 112, as shown in FIGS. 1A and 1B.

Operation 120 of the example process flow is illustrated using multiple diagrams. As shown in the bottom-left diagram of operation 120, a laser 122 can be used to form a groove in the signal lead segment 114. For instance, as shown in the bottom-right diagram for operation 120, the laser 122 can be used to form a groove 124 in the signal lead segment 114. The profile of the groove 124 shown for operation 120 is given by way of example. The shape, groove depth, profile of the groove, etc. can vary depending on the particular implementation. For instance, a depth of the laser formed groove 124 along the line H in FIG. 1B can vary along a length (or a width) of the groove 124, where the length can be measured along the line L in FIG. 1B and the width can be measured along the line W in FIG. 1B. Examples of laser formed grooves having various profiles (e.g., lengths, widths and/or depths) are show, for example, in FIGS. 2A, 3A and 6A-6E.

For operation 120 shown in FIG. 1B, a bottom surface of the groove 124 can be formed, by the laser 122, to be concave (e.g., shallower at a center portion of the groove 124 along the line L than at the ends of the groove 124 along the line L). In such approaches, a height (measured along the line H in FIG. 1B) of metal of the signal lead segment 114 remaining after forming the groove 124 can be highest at the center portion of the groove along its length along the line L (such as the center point C illustrated in FIG. 4B), where that height continually decreases (along a curved line) when moving, from the center portion of the groove 124, toward the ends of the groove 124 in either direction along the line L (as also shown in FIG. 4B). In some implementations, the groove 124 can be formed, by the laser 122, to be convex (e.g., deeper at a center portion of the groove 124 than the ends of the groove 124 along the line L). In such approaches, a height of metal (along the line H) of the signal lead segment 114 remaining after forming the groove 124 can be lowest at the center portion of the groove, where that height continually increases when moving, from the center portion of the groove 124 along the line L, toward the ends of the groove 124 along the line L. Varying the depth of the groove 124, such that a bottom surface of the groove 124 is concave or convex can increase a surface area of solder plating formed in the groove 124 and, as a result, increase a corresponding solder plated area of a solder wettable signal lead flank (e.g., flank 144) that is formed from (in association with, at, etc.) the groove 124.

In still other implementations, the laser 122 can be used to form grooves having other configurations, such as grooves with flat bottom surfaces, grooves with notches, symmetric grooves, asymmetric grooves, etc. Depending on the particular implementation and the desired profile of the groove 124, the laser 122 can be a high-power laser (e.g., such as $CO_2$ laser). Example side views of various possible groove profiles are shown in FIGS. 6A-6E, which are discussed below.

The top-left diagram for operation 120 in FIG. 1B illustrates a highlighted area of the diagram shown for operation 110 after formation of grooves 124 (not labeled in the top-left diagram) in the signal lead segments 114. The top right diagram of operation 120 illustrates a magnified view of the highlighted area shown in top left diagram of operation 120. As shown in the top-right diagram of operation 120, grooves 124 have been formed, e.g., using the laser 122, in each of the signal lead segments 114 of the leadframe structure 112a for the packaged device that is in the top left corner of the leadframe matrix 112 (and highlighted in FIG. 1B). While not specifically shown in FIG. 1B, grooves 124 can be similarly formed in signal lead segments 114 of each of the leadframe structures 112a shown in FIG. 1B.

FIG. 1C illustrates operation 130 of the example manufacturing process flow of FIGS. 1A-1D. Operation 130 may include performing a plating to form a solder plating (e.g., a tin plating) 132 on exposed portions of the leadframe matrix 112, including surfaces of the lead frame segment 114 and surfaces within the groove 124 formed at operation 120. A thickness of the solder plating 132 will depend on the particular implementation.

FIG. 1D illustrates operation 140 of the process flow of FIGS. 1A-1D and includes three views of a singulated device 142. In the method 100, each individual packaged semiconductor device 142 can be singulated from the solder plated leadframe matrix 112 using, for example, a device singulation operation, such as those approaches described herein. The views of the singulated device 142 shown in FIG. 1D include, from right to left, a bottom-side perspective view, a top-side perspective view and a side view. In an implementation, the device 142 can be singulated from the solder plated leadframe matrix 112 by separating, at the respective grooves 124, first portions of the signal lead segments 114 from respective second portions of the signal lead segments 114, where this singulation (separation) operation defines signal leads 114a from the signal lead segments 114 shown in, for example, FIG. 1B.

As noted above, depending on the particular implementation, different approaches can be used to singulate the device 142 from the leadframe matrix 112. For example, a punch singulation tool can be used, e.g., for devices produced using a leadframe matrix or strip, such as illustrated in FIGS. 1A-1D. In other implementations, a saw can be used singulate individual packaged devices from one other, e.g., for devices produced in panel form, such those illustrated in FIGS. 7A-11C, which are discussed further below. As is discussed in further detail below, singulating the device 142 by separating the first portion of the signal lead segment 114 from the second portion of the signal lead segment 114 can expose metal of the metal leadframe matrix 112 through the solder plating 132, e.g., on surface of a signal lead flank 144. As shown in FIG. 1, the signal lead flank 144 is disposed at the end of the signal lead 114a along an axis FA that is orthogonal to a longitudinal axis SLA of the signal lead 114a. The axis FA, as shown in FIG. 1D, can also be orthogonal to a primary plane of the packaged semiconductor device 142, where the primary plane is defined by the X-axis and the Y-axis shown in FIGS. 1A-1D (e.g., defined by a surface of the molding compound). In other implementations, the signal lead flank 144 can be aligned along an axis that at an angle to, but is not orthogonal to, a longitudinal axis (e.g. longitudinal axis SLA) of a corresponding signal lead and/or a primary plane of a corresponding packaged semiconductor device, such as a plane defined by a semiconductor die included in the packaged semiconductor device (e.g., the plane defined by the X-axis and the Y-axis shown in FIGS. 1A-1D).

In this example, a surface of the signal lead flank 144 is shown as being discontinuous and includes a first portion 144a, a second portion 144b and a third portion 144c, where the portions 144a-144c can define a stair-stepped shape of the flank 144. In this example, the flank portions 144a and 144b can, alternatively, be considered a first portion of the flank 144 that is defined by the laser grooving at operation 120 (e.g., a groove portion), while the flank portion 144c can be considered a second flank portion that is defined by singulation process (e.g., using the approaches described herein) of operation 140 (e.g., a singulation portion). In other examples, the signal lead flank 144 can have a continuous surface (e.g., a substantially continuous surface), such as the signal lead flank shown in FIG. 4A.

As illustrated in the side view of the device 142 for the operation 140 in FIG. 1D, the signal lead 114a, in this implementation, can extend a distance D away from the molding compound 116 of the device 142, such that the flank 144 of the signal lead 114a is disposed away (e.g., at the distance D) from a surface of the molding compound 116. The portions 144a, 144b and 144c of the flank 144 are shown for purposes of illustration and may not be shown to scale. For instance, the portion 144b of the flank can be shorter (e.g., along the axis SLA) than illustrated in FIG. 1D, such that the distance D is reduced. In other implementations, the one or more of the portions 144a, 144b and 144c of the flank 144 of the signal lead 114a can be coplanar (approximately coplanar) with a surface of the molding compound of the device 142. For instance, for packaged semiconductor devices that are produced in panel form and singulated using saw singulation, a flank of a given signal lead can be defined, at least in part, by the saw singulation operation, where a saw is used to separate individual packaged devices by cutting through molding compound and through laser formed grooves in the signal lead segments.

FIG. 2A is a diagram illustrating a cross-sectional view of a laser grooved signal lead segment 214, according to an implementation. Specifically, FIG. 2A illustrates a sectional view of a portion of the signal lead segment 214 after forming, using a laser, a groove 224 in the signal lead segment 214 and forming a solder plate 232 on the signal lead segment 214, such as was described above with respect to operations 120 and 130 of the manufacturing process flow shown in FIGS. 1B and 1C for signal lead segments 114.

As shown in FIG. 2A, the groove 224 can include a notch 226 that is formed (during the laser grooving operation) at one side (a right side) of the groove 224. During singulation, the signal lead segment 214 can be separated at the notch 226 to define a signal lead for a packaged semiconductor device from the portion of the signal lead segment 214 that is to the right of the notch 226. In an implementation, after singulation, the portion of the signal lead segment 214 that is to the left of the notch 226 can be discarded. In other implementations, the notch 226 could be formed at the left side of the groove 214, or notches 226 could be formed at both sides of the groove 214. As shown in FIG. 2A (in similar manner as discussed with respect to FIG. 1B), a width of the groove 224 can be measured along the line W, a depth of the groove 224 (at any given point along it's width) can be measured along the line H, while a length of the groove 224 can be measured along the line L, which goes in and out of the page for FIG. 2A.

FIG. 2B is a diagram illustrating a singulation process for the signal lead segment 214 of FIG. 2A, according to an implementation. As shown in FIG. 2B, the signal lead segment 214 extends between two adjacent encapsulated semiconductor devices (e.g., devices next to each other along an X axis or Y axis in a corresponding leadframe matrix). The first semiconductor device includes a first semiconductor die 218a and molding compound 216a, while the second semiconductor device includes a second semiconductor die 218b and molding compound 216b. As shown in FIG. 2B, respective portions of the signal lead segment 214 are encapsulated in the molding compound 216a and the molding compound 216b, and the signal lead segment 214 is electrically coupled with both the semiconductor dice 218a and 218b.

As illustrated in FIG. 2B, two grooves 224 have been formed in the signal lead segment 214 and various portions 231, 232, 233, 234 and 235 of a punch-singulation tool have been arranged above and below the laser grooved signal lead segment 214. In the arrangement shown in FIG. 2B, the portions 231 and 232 of the singulation tool that are arranged above the leadframe segment 214 (upper tool portions) and disposed within the grooves 224 can be pushed vertically downward to singulate (separate, punch, etc.) the leadframe segment 214 at the grooves 224, so as to define signal leads with solder wettable flanks, such as the signal lead flanks illustrated and described herein, for the packaged semiconductor devices shown in FIG. 2B.

In other implementations, the portions 233, 234 and 235 of the singulation tool that are arranged below the leadframe segment 214 (lower tool portions) can be pushed vertically upward to singulate (separate, punch, etc.) the leadframe segment 214 at the grooves 224 to define signal leads with wettable flanks for the packaged semiconductor devices. In the arrangement show in FIG. 2B, after singulation, the portion of the signal lead segment 214 that is disposed between the two grooves 224 can be discarded.

FIG. 3A is a diagram illustrating a cross-sectional view of a laser grooved signal lead segment 314, according to an implementation. Specifically, FIG. 3A illustrates a sectional view of a portion of the signal lead segment 314 after forming, using a laser, a groove 324 in the signal lead segment 314 and forming a solder plate 332 on the signal lead segment 314, such as was described above with respect to operations 120 and 130 of the manufacturing process flow shown in FIGS. 1A-1D for signal lead segments 114.

As shown in FIG. 3A, the groove 324 can be a V-shaped groove. During singulation, the signal lead segment 314 can be separated at the V-shaped groove 324 to define a signal lead for a packaged semiconductor device from the portion of the signal lead segment 314 that is to the right of the V-shaped groove 324. In some implementations, after singulation, the portion of the signal lead segment 314 that is to the left of the V-shaped groove 324 can be discarded. In other implementations, after singulation, the portion of the signal lead segment 314 that is to the left of the V-shaped groove 324 can be included in a signal lead for a packaged semiconductor device and the portion to the right of the V-shaped groove 324 can be discarded. As shown in FIG. 3A (in similar manner as discussed with respect to FIGS. 1B and 2A), a width of the groove 324 can be measured along the line W, a height of the groove 324 (at any given point along it's width) can be measured along the line H, while a length of the groove 224 can be measured along the line L, which goes in and out of the page for FIG. 3A.

FIG. 3B is a diagram illustrating a singulation process for the signal lead segment 314 of FIG. 3A, according to an implementation. As shown in FIG. 3B, the signal lead segment 314 extends between two adjacent encapsulated semiconductor devices (e.g., devices next to each other along an X axis or Y axis in a leadframe matrix). The first semiconductor device includes a first semiconductor die 318a and molding compound 316a, while the second semiconductor device includes a second semiconductor die 318b and molding compound 316b. As shown in FIG. 3B, respective portions of the signal lead segment 314 are encapsulated in the molding compound 316a and the molding compound 316b, and the signal lead segment 314 is electrically coupled with both the semiconductor dice 318a and 318b.

As illustrated in FIG. 3B, two V-shaped grooves 324 have been formed in the signal lead segment 314 and various portions 331, 332 and 333 of a punch-singulation tool have been arranged above and below the laser grooved signal lead segment 314. In the arrangement shown in FIG. 3B, the portion 331 and 332 of the singulation tool that are arranged above the signal lead segment 314 (upper tool portions) can be pushed vertically downward to singulate (separate, punch, etc.) the signal lead segment 314 at the V-shaped grooves 324, so as to define signal leads with wettable flanks for the packaged semiconductor devices shown in FIG. 3B, such as the wettable signal lead flanks described herein. In other implementations, the portion 333 of the singulation tool that is below the signal lead segment 314 (lower tool portion) can be pushed vertically upward to singulate (separate, punch, etc.) the signal lead segment 314 at the V-shaped grooves 324 to define signal leads with wettable flanks for the packaged semiconductor devices. In the arrangement show in FIG. 3B, after singulation, the portion of the leadframe segment 314 disposed between the two V-shaped grooves 324 can be discarded.

FIG. 4A is diagram illustrating a cross-sectional view of a packaged semiconductor device (device) and corresponding signal lead produced using, for example, the method of FIGS. 1A-1D, according to an implementation. FIG. 4B is a diagram illustrating a solder wettable flank of the signal lead of FIG. 4A. The packaged semiconductor device of FIG. 4A and the wettable signal lead flank shown in FIGS. 4A and 4B can be an implementation of the device 142 and corresponding signal lead 114a shown in FIG. 1D, for example.

In FIG. 4A, the illustrated device includes molding compound 416, which may encapsulate, at least partially, e.g., a semiconductor die (not shown). The device in FIG. 4A, also includes a signal lead 414a that can be partially encapsulated in the molding compound 416. The signal lead 414a can include a metal portion 414m that can be defined from a corresponding signal lead segment using the techniques described herein. As shown in FIG. 4A, the signal lead segment 414a can be plated with a solder plating 432 that is disposed on both the upper and lower surfaces of the signal lead 414a, and also disposed on at least a portion of the solder wettable signal lead flank 444 of the device. For reference purposes, the axis SLA and the lines H and L of FIGS. 1A-1D are also included in FIGS. 4A and 4B in corresponding orientations as in those drawings (though inverted with respect to, at least, FIGS. 1A-1C.) As compared with the wettable flank 144 of the signal lead 114a shown schematically in FIG. 1D (which is illustrated as having a discontinuous surface, the flank 444 of the signal lead 414a shown in FIG. 4A has substantially continuous surface that does not have a stair-stepped shape, such as shown for the flank 144 of the signal lead 114a shown in FIG. 1D.

As shown in FIGS. 4A and 4B, a surface of the solder wettable flank 444 of the signal lead 414a can include an exposed surface 440 of the metal portion 414m of the signal lead 414a. As described herein, the surface 440 of the metal portion 414m can be exposed when the signal lead 414a is separated (singulated, punch singulated, saw singulated, cleaved, etc.) from a corresponding signal lead segment 414. As also shown in FIGS. 4A and 4B, the surface of the solder wettable flank 444 of the signal lead 414a can also include a first portion of 445 of the solder plating 432 and a second portion of the solder plating 446, where the portions 445 and 446 can form a continuous solder plating on the flank 444.

In an implementation, such as using the manufacturing process flow of FIGS. 1A-1D, the portion 445 of the solder plating 432 (e.g., disposed below the exposed surface 440 of the metal portion 414m in FIG. 4B) can be a portion of the solder plating 432 that is formed in a laser groove defined in a signal lead segment. The portion 446 of the solder plating 432 (e.g., disposed above and to the left and right of the exposed surface 440 of the metal portion 414m in FIG. 4B) can be a portion of the solder plating 432 that is formed on un-grooved portions of a corresponding signal lead segment (e.g., prior to singulation).

In some implementations, the portions 445 and 446 of the solder plating 431 on the surface of the solder plating 432 (portions 445 and 446) on the surface of the solder wettable flank 444 flank of the signal lead 414a can define at least 75% of the surface area of the flank 444, while 25% or less of the surface area of the flank 444 can be defined by the surface 440 of the exposed metal of the metal portion 414m. In other implementations, the portions 445 and 446 of the solder plating 431 on the surface of the solder plating 432 (portions 445 and 446) on the surface of the solder wettable flank 444 flank of the signal lead 414a can define at least 80% of the surface area of the flank 444, while 20% or less of the surface area of the flank 444 can be defined by the surface 440 of the exposed metal of the metal portion 414m. In other implementations, other coverage percentages are possible.

As shown in FIG. 4B, a perimeter of the surface 440 of the exposed metal of the metal portion 414m can have at least one curved edge 441 that is defined when forming a laser groove in a corresponding signal lead segment. As noted herein, forming a laser groove with a concave profile (e.g., as illustrated by the curved edge 441) can increase the solder plated area on the surface (continuous or discontinuous) of an associated solder wettable flank (e.g., as defined by the portion 445 of the solder plating 432, as discussed above).

As with solder wettable flanks of signal leads described herein with respect to other drawings, the flank 444 in FIGS. 4A and 4B is disposed at an end of the signal lead 414a, where a first portion of the surface of the flank 444 is defined, at least in part, by a laser groove, and a second portion of a surface of the flank 44 is defined by a cleave in (e.g., singulation of) a laser grooved signal lead segment (e.g., solder plated) of a metal leadframe structure.

As shown in FIG. 4B, a center portion of the surface 440 of the exposed metal of the metal portion 414m (as indicated by the vertical line C in FIG. 4B) can have a height HC along the line H (e.g., where the line H is approximately orthogonal to a primary plane of the device of FIGS. 4A and 4B, such as described above with respect to FIG. 1D). As illustrated in FIG. 4B, due to the curved edge 441 of the surface 440 (defined by a laser), the height HC of the center portion C of the surface 440 is greater than a height of the surface 440 of the exposed metal that is laterally disposed from the center portion (e.g., a height of the surface 440 that is measured along the line H to the left or right of the vertical line C). Depending on the particular implementation, the surface 440 can have a crescent shape or a semicircle shape. In other implementations, the surface 440 can have other shapes, such as rectangles, squares, triangles, etc. The particular shape of the surface 440 will depend on the particular implementation.

FIG. 5A is a diagram illustrating a sectional plan view of a packaged semiconductor device producing using the method of FIG. 1 after solder mounting on a printed circuit board (PCB), according to an implementation. FIG. 5A illustrates a PCB 510 that includes a plurality of contact pads 520, which can be included in corresponding printed circuit traces of the PCB 520. In the example shown in FIG. 5A, signal leads 514a (with solder wettable flanks produced using the laser grooving approaches described herein) of a packaged semiconductor device 542 can be soldered (using a reflow process) to respective contact pads 520 of the PCB 510. FIG. 5B is a diagram illustrating a perspective views of the packaged semiconductor device 542 and PCB 510 of FIG. 5A. As shown in FIG. 5, solder plating that is disposed on solder wettable flanks 544 of the signal leads 514a can form, at least in part, high-quality, low-resistance solder fillets 522 with the contact pads 520 of the PCB 510.

FIGS. 6A-6E are diagrams illustrating side profile views of various laser grooves in signal leads of packaged semiconductor devices, according to respective implementations. The groove profiles shown in FIGS. 6A-6E are given by way of example to illustrate flexibility of using laser grooves to produce packaged semiconductor devices having signal leads with wettable flanks, and are sectional views of corresponding signal lead segments after laser grooving and prior to solder plating (such as after operation 120 and before operation 130 of the process flow illustrated in FIGS. 1A-1D). Variations in groove profiles or designs can allow for adjustments in various aspects of manufacturing throughput time (e.g., narrower groove can be processed faster than the wide groove), increasing useful life of laser used in such approaches, adjustments for manufacturing tolerances of laser equipment (e.g., when needed over the life of a given laser used to form such laser grooves).

In FIGS. 1B, 2A and 3A, for the laser groove profiles illustrated in FIGS. 6A-6E, groove widths are along the line W, groove depths are along the line H and groove lengths are along the line L, which goes in and out of the page for FIGS. 6A-6E. Further, in some implementations, cross-sections taken along line L (in and out of the page) of the grooves illustrated in FIGS. 6A-6E, as well as other implementations of laser formed grooves in leadframe segments (such as the examples described herein) can have at least one curved edge (such as the curved edge 441 of the perimeter of the exposed metal surface 440 of the signal lead 414a in FIG. 4B).

While specific examples of groove profiles are shown in FIGS. 6A-6E, the configuration (profile) of a particular laser groove formed in a given signal lead segment will depend on the particular implementation. For instance, the profile of a given laser groove formed in a signal lead segment may depend on a singulation tool used, a leadframe structure of the packaged device, as well as a number of other factors. Further, the type of singulation that is used to separate the signal lead segments of FIGS. 6A-6E (e.g., in association with the laser formed grooves) will depend on the particular implementation. For instance, the type of singulation used may depend on whether the packaged devices being singulated are produced using a leadframe matrix or strip, where punch singulation may be used, or if the packaged devices being singulated are produced in panel form, where saw singulation may be used. Further, in some implementations, symmetric and asymmetric grooves can be formed where the sidewalls of the grooves (e.g., at the left and right of the groove along line W) have slopes that are different than those shown in FIGS. 6A-6E. For instance, grooves with vertical sidewalls can be formed. Alternatively, grooves with sidewalls that form larger angles with a bottom surface of a corresponding groove than the angles shown in FIG. 6A-6E can be formed.

Also in FIGS. 6A-6E, vertical dashed lines are shown to illustrate a separation point (e.g., the location where singulation may be performed) for each respective signal lead segment and corresponding laser groove illustrated in those drawings. FIG. 6A is a diagram illustrating a sectional view of a signal lead segment 614a in which a laser groove 624a has been formed. The groove 624a shown in FIG. 6A is similar to the groove 224 shown in FIG. 2A, where a notch 626a is formed at the right edge of the groove 624a. In other implementations, the notch 626a could, alternatively, be formed on the left side of the groove 624a. FIG. 6B is a diagram illustrating a sectional view of a signal lead segment 614b in which a laser groove 624b has been formed. The groove 624b shown in FIG. 6B, as compared to the groove 624a shown in FIG. 6A, may be narrower along line W and deeper along line H. Similarly, a notch 626b that is formed at the right edge of the groove 624b can be narrower and deeper than the notch 626a shown in FIG. 6A. As indicated by the dashed vertical lines in FIGS. 6A and 6B, singulation can be performed such that the signal lead segments 614a and 614b separate, respectively, below notches 626a and 626b.

FIG. 6C is a diagram illustrating a sectional view of a signal lead segment 614c in which a laser groove 624c has been formed. The groove 624c is a symmetric groove and includes shallow notches 626c at both the right edge and the left edge of the groove 624c. As indicated by the dashed vertical line in FIG. 6C, singulation can be performed such that the signal lead segment 614c separates below the center (approximately the center) of the groove 624*c*, where a bottom surface of the groove 624*c* and the notch 626*c*, along the line L, can have a curved shape (concave, convex, etc.), such as described herein with respect to other laser groove implementations.

FIG. 6D is a diagram illustrating a sectional view of a signal lead segment 614*d* in which a laser groove 624*d* has been formed. The groove 624*d* is an asymmetric groove without notches at either edge of the groove 624*d*. As shown in FIG. 6D, the walls of the groove 624*d* (at the left side and the right side of the groove 624*d* along the line W) have different slopes (e.g., form different angles with respect to the bottom surface of the groove 624*d*). In some implementations, other laser formed grooves (e.g., grooves with notches, such as those shown in FIGS. 6A-6C) can include such asymmetric walls. As indicated by the dashed vertical line in FIG. 6D, singulation can be performed such that the signal lead segment 614*d* separates below the center (approximately the center) of the bottom surface of the groove 624*d*.

FIG. 6E is a diagram illustrating a sectional view of a signal lead segment 614*e* in which a laser groove 624*e* has been formed. The groove 624*e* is a symmetric groove without notches at either edge of the groove 624*e*. As indicated by the dashed vertical line in FIG. 6E, singulation can be performed such that the signal lead segment 614*e* separates below the center (approximately the center) of the groove 624*e*. In an example implementation, a punch singulation tool or saw could be used to remove the portion of the signal lead segment 614*e* that is vertically disposed below the bottom surface of the groove 624*e*.

Figure 7A:
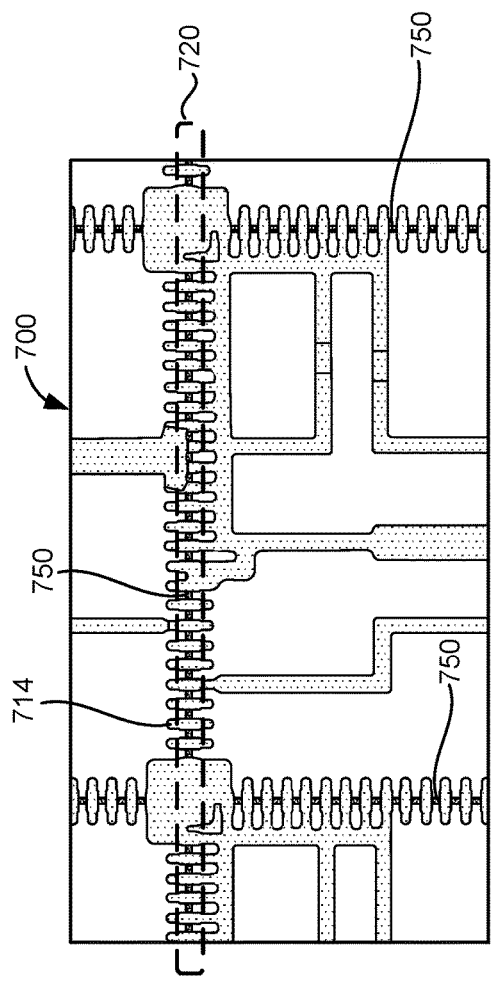
FIG. 7A is a diagram illustrating a partial plan view of a plurality of packaged semiconductor devices assembled in panel form prior to laser grooving of signal lead segments, solder plating and singulation, according to an implementation.

FIG. 7A is a diagram illustrating a partial plan view of a plurality of packaged semiconductor devices assembled in a panel 700 (e.g., using a single molding cavity) prior to laser grooving of signal lead segments 714, solder plating and singulation, according to an implementation. In FIG. 7A, the dashed line 720 indicates an area in which laser grooving of the signal lead segments 714 can be performed prior to performing a solder plating process to solder plate the signal lead segments 714, including solder plating surfaces of the laser formed grooves (which can have configurations such as those described herein, e.g., have curved surfaces, include notches, are symmetric or asymmetric, etc.) in the signal lead segments 714, as well as to solder plate other exposed portions of a corresponding leadframe structure. It will be appreciated that laser grooving of the other signal lead segments 714 shown in FIG. 7A (outside the region designated by the line 720) can also be performed. The lines 750 in FIG. 7A indicate cut lines where saw singulation of the individual packaged semiconductor devices of the panel 700 can be performed.

Figure 7B:
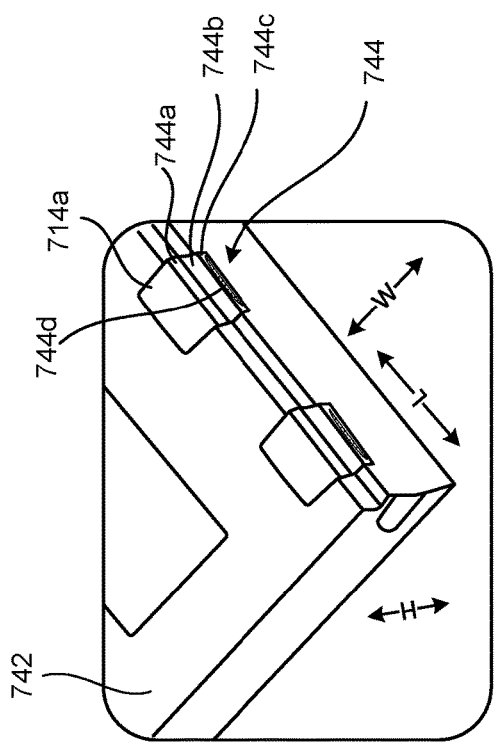
FIG. 7B is a diagram illustrating a perspective view of a packaged semiconductor device of the plurality of package semiconductor devices of FIG. 7A after laser grooving of signal leads, solder plating and singulation, according to an implementation.

FIG. 7B is a diagram illustrating a perspective view of a packaged semiconductor device 742 of the plurality of packaged semiconductor devices of the panel 700 shown in FIG. 7A after laser grooving of signal lead segments 714, solder plating (e.g., such as described herein) and saw singulation, according to an implementation. As shown in FIG. 7B, the device 742 can include a solder-plated signal lead 714*a* that includes a wettable flank 744. The wettable flank 744, in this example, may be formed as a result of laser grooving of the signal leads segments 714 of FIG. 7A, solder plating of exposed portions a corresponding leadframe structure of the panel 700, including surfaces of the laser formed grooves in the signal lead segments 714, and saw singulation of the individual packaged semiconductor device of the panel 700. The wettable flank 744, as shown in FIG. 7B, can include flank portions 744*a*, 744*b* and 744*c*, which can be arranged in similar fashion as the flank portions 144*a*, 144*b* and 144*c* of the wettable flank 144 shown in FIG. 4D and define a discontinuous surface of the wettable flank 744. As shown in FIG. 7B, exposed metal 744*d* of the signal lead 714*a* can be included in a surface of the wettable flank 744 (e.g., on at least part of a surface of the flank portion 744*c*), where the exposed metal 744*d* is exposed as a result of the saw singulation operation.

As with the surface 440 of the exposed metal of the metal portion 414*m* shown in FIG. 4B, a surface of the exposed metal 744*d* in FIG. 7B can have a perimeter that includes at least one curved edge, where such curved edges can defined when forming a laser groove in a corresponding signal lead segment. That is, as with the surface 440 in FIG. 4B, a surface of the exposed metal 744*d* can be crescent shaped, half-moon shaped, semicircle shaped, et. As noted herein, forming a laser groove with a concave profile (e.g., to create a curved edge of the exposed metal 744*d*) can increase the solder plated area on the surface (continuous or discontinuous) of an associated solder wettable flank (e.g., as defined by the portions 744*a*, 744*b* and 744*c* of the flank 744 shown in FIG. 7B).

FIG. 8A is a diagram illustrating a partial plan view of a laser groove pattern for adjacent packaged semiconductor devices assembled in panel form, according to an implementation. As shown in FIG. 8A, a panel 800 can include adjacent packaged semiconductor devices 842*a* and 842*b*. In the panel 800, signal lead segments 814 extend between the devices 842*a* and 842*b*. Regions 820 in FIG. 8A illustrate a laser grooving pattern, indicating where laser grooving of the signal lead segments 814 can be performed. As shown by the laser grooving pattern of the regions 820, laser grooving can be performed to form two grooves in each signal lead segment 814 (e.g., to form a first groove adjacent to the device 842*a* and a second groove adjacent to the device 842*b*). In an implementation, each laser grooving region 820 can be approximately 200 mm×300 mm. In other implementations, examples of which are discussed herein, other dimensions are possible.

FIG. 8B is a diagram schematically illustrating a cross-sectional view of a signal lead segment 814 after forming two symmetric laser grooves 824 in the signal lead segment 814 according to the laser groove pattern of FIG. 8A, prior to singulation of the adjacent packaged semiconductor devices 842*a* and 842*b*. In some implementations, the grooves 824 can have configurations or features such as those described herein, e.g., have curved surfaces, include notches, be symmetric or asymmetric, etc.

FIG. 8C is a diagram schematically illustrating a cross-sectional view of signal leads 814*a* and 814*b* of, respectively, the adjacent packaged semiconductor devices 842*a* and 842*b* of the panel 800 shown in FIG. 8A after laser grooving of the signal lead segments 814, as illustrated by FIG. 8B, and saw singulation. As shown in FIG. 8C, the saw singulation process can remove a portion 818 of the signal lead segment 814 that is disposed between the signal leads 814*a* and 814*b*. The saw singulation operation can also remove molding compound that is disposed between the packaged semiconductor devices 842*a* and 842*b*, as well as expose metal of the leadframe structure on a portion of a surface area of wettable flanks 844*a* and 844*b*. For purposes of reference, lines W, H and L, such as described herein with respect to, e.g., FIGS. 1B, 2A, 3A, 4A-4B and 6A-6E, are also included in FIGS. 8A-8C (with the lines for FIGS. 8B and 8C being shown between those drawings).

FIG. 9A is a diagram illustrating a partial plan view of a laser groove pattern for adjacent packaged semiconductor devices assembled in panel form, according to an implementation. As shown in FIG. 9A, a panel 900 can include adjacent packaged semiconductor devices 942a and 942b. In the panel 900, signal lead segments 914 extend between the devices 942a and 942b. Regions 920 in FIG. 9A illustrate a laser grooving pattern, indicating where laser grooving of the signal lead segments 914 can be performed. As shown by the laser grooving pattern of the regions 920, laser grooving can be performed to form two grooves in each signal lead segment 914 (e.g., to form a first groove adjacent to the device 942a and a second groove adjacent to the device 942b). In an implementation, each laser grooving region 920 can be approximately 100 mm×300 mm. In other implementations, examples of which are discussed herein, other dimensions are possible.

FIG. 9B is a diagram schematically illustrating a cross-sectional view of a signal lead segment 914 after forming two symmetric (V-shaped) laser grooves 924 in the signal lead segment 914 according to the laser groove pattern of FIG. 9A, prior to singulation of the adjacent packaged semiconductor devices 942a and 942b. In some implementations, the grooves 924 can have configurations or features such as those described herein, e.g., have curved surfaces, include notches, be symmetric or asymmetric, etc.

FIG. 9C is a diagram schematically illustrating a cross-sectional view of signal leads 914a and 914b of, respectively, the adjacent packaged semiconductor devices 942a and 942b of the panel 900 shown in FIG. 9A after laser grooving of the signal lead segments 914, as illustrated by FIG. 9B, and saw singulation. As shown in FIG. 9C, the saw singulation process can remove a portion 918 of the signal lead segment 914 that is disposed between the signal leads 914a and 914b. The saw singulation operation can also remove molding compound that is disposed between the packaged semiconductor devices 942a and 942b, as well as expose metal of the leadframe structure on a portion of a surface area of wettable flanks 944a and 944b. For purposes of reference, lines W, H and L, such as described herein with respect to, e.g., FIGS. 1B, 2A, 3A, 4A-4B and 6A-6E, are also included in FIGS. 9A-9C (with the lines for FIGS. 9B and 9C being shown between those drawings).

FIG. 10A is a diagram illustrating a partial plan view of a laser groove pattern for adjacent packaged semiconductor devices assembled in panel form, according to an implementation. As shown in FIG. 10A, a panel 1000 can include adjacent packaged semiconductor devices 1042a and 1042b. In the panel 1000, signal lead segments 1014 extend between the devices 1042a and 1042b. Regions 1020 in FIG. 10A illustrate a laser grooving pattern, indicating where laser grooving of the signal lead segments 1014 can be performed to define grooves with a square shape (from this top, plan view) that do not extend across the entire dimension of the signal lead 1014 along the line L. As shown by the laser grooving pattern of the regions 1020, laser grooving can be performed to form two grooves in each signal lead segment 1014 (e.g., to form a first groove adjacent to the device 1042a and a second groove adjacent to the device 1042b). In an implementation, each laser grooving region 1020 can be approximately 100 mm×100 mm. In other implementations, examples of which are discussed herein, other dimensions are possible.

FIG. 10B is a diagram schematically illustrating a cross-sectional view of a signal lead segment 1014 after forming two symmetric (V-shaped) laser grooves 1024 in the signal lead segment 1014 according to the laser groove pattern of FIG. 10A, prior to singulation of the adjacent packaged semiconductor devices 1042a and 1042b. In some implementations, the grooves 1024 can have configurations or features such as those described herein, e.g., have curved surfaces, include notches, be symmetric or asymmetric, etc.

FIG. 10C is a diagram schematically illustrating a cross-sectional view of signal leads 1014a and 1014b of, respectively, the adjacent packaged semiconductor devices 1042a and 1042b of the panel 1000 shown in FIG. 10A after laser grooving of the signal lead segments 1014, as illustrated by FIG. 10B, and saw singulation. As shown in FIG. 10C, the saw singulation process can remove a portion 1018 of the signal lead segment 1014 that is disposed between the signal leads 1014a and 1014b. The saw singulation operation can also remove molding compound that is disposed between the packaged semiconductor devices 1042a and 1042b, as well as expose metal of the leadframe structure on a portion of a surface area of wettable flanks 1044a and 1044b. For purposes of reference, lines W, H and L, such as described herein with respect to, e.g., FIGS. 1B, 2A, 3A, 4A-4B and 6A-6E, are also included in FIGS. 10A-10C (with the lines for FIGS. 10B and 10C being shown between those drawings).

FIG. 11A is a diagram illustrating a partial plan view of laser groove and molding compound ablation pattern for adjacent packaged semiconductor devices assembled in panel form, according to an implementation. As shown in FIG. 11A, a panel 1100 can include adjacent packaged semiconductor devices 1142a and 1142b. In the panel 1100, signal lead segments 1114 extend between the devices 1142a and 1142b, and may be, at least partially, covered with molding compound. Regions 1120 in FIG. 11A illustrate a laser grooving pattern, indicating where laser grooving of the signal lead segments 1114 and/or ablation of molding compound disposed on the signal lead segments 1114 can be performed. As shown by the laser grooving pattern of the regions 1120, laser grooving can be performed to form a single groove in each signal lead segment 1014 that extends between the 1142a and 1142b. Further, regions 1120 can also indicate areas where molding compound is removed (ablated, etc.). In an implementation, each laser grooving region 1120 can be approximately 400 mm×300 mm. In other implementations, examples of which are discussed herein, other dimensions are possible.

FIG. 11B is a diagram schematically illustrating a cross-sectional view of a signal lead segment 1114 after forming a laser groove 1124 in the signal lead segment 1114 according to the laser groove pattern of FIG. 11A, prior to singulation of the adjacent packaged semiconductor devices 1142a and 1142b. In some implementations, the groove 1124 can have a configuration or features such as those described herein, e.g., have curved surfaces, include notches, be symmetric or asymmetric, etc.

FIG. 11C is a diagram schematically illustrating a cross-sectional view of signal leads 1114a and 1114b of, respectively, the adjacent packaged semiconductor devices 1142a and 1142b of the panel 1100 shown in FIG. 11A after laser grooving of the signal lead segments 1114, as illustrated by FIG. 11B, and saw singulation. As shown in FIG. 11C, the saw singulation process can remove a portion 1118 of the signal lead segment 1114 that is disposed between the signal leads 1114a and 1114b. The saw singulation operation can also remove molding compound (e.g., that was not removed by the laser grooving process) that is disposed between the packaged semiconductor devices 1142a and 1142b, as well as expose metal of the leadframe structure on a portion of a surface area of wettable flanks 1144a and 1144b. For purposes of reference, lines W, H and L, such as described herein with respect to, e.g., FIGS. 1B, 2A, 3A, 4A-4B and 6A-6E, are also included in FIGS. 11A-11C (with the lines for FIGS. 11B and 11C being shown between those drawings).

Figure 12:
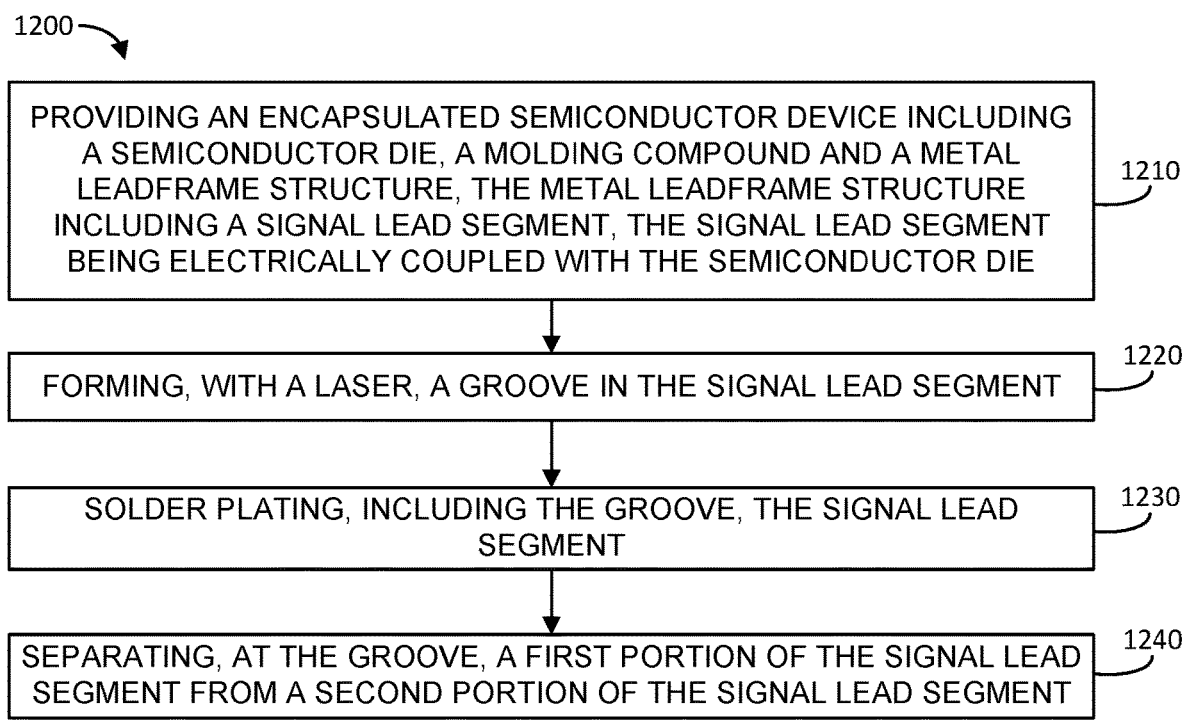
FIG. 12 is a flowchart illustrating a method for producing packaged semiconductor devices with solder wettable flanks using the techniques described herein, according to an embodiment.

FIG. 12 is a flowchart illustrating a method 1200 for producing packaged semiconductor devices with solder wettable flanks using the techniques described herein, according to an embodiment. In certain implementations, other methods and/or processing operations are possible.

As shown in FIG. 12, the method 1200 includes, at block 1210, providing an encapsulated semiconductor device including a semiconductor die, a molding compound and a metal leadframe structure, where the metal leadframe structure includes a signal lead segment. The signal lead segment can be electrically coupled with the semiconductor die. At block 1220, the method 1200 includes forming, with a laser, a groove in the signal lead segment. At block 1230, the method 1200 includes solder plating, including the groove, the signal lead segment. At block 1240, the method 1200 includes separating, at the groove, a first portion of the signal lead segment from a second portion of the signal lead segment.

At block 1210 of the method 1200, the encapsulated semiconductor device can be included in a panel of a plurality of encapsulated semiconductor devices formed using a single molding cavity. In other implementations, the encapsulated semiconductor device can be included in a matrix of a plurality of encapsulated semiconductor devices formed using a plurality of respective molding cavities.

In the method 1200, separating the first portion of the signal lead segment from the second portion of the signal lead segment at block 1240 can include performing a saw singulation of the encapsulated semiconductor device. In other implementations, separating the first portion of the signal lead segment from the second portion of the signal lead segment at block 1240 can include performing a punch singulation of the encapsulated semiconductor device. Also, at block 1240, separating the first portion of the signal lead segment from the second portion of the signal lead segment can expose metal of the metal leadframe structure through the solder plating.

Further in the method 1200, forming the groove in the signal lead segment at block 1220 can include forming a symmetric groove. In other implementations, forming the groove in the signal lead segment 1220 can include forming an asymmetric groove. A profile of the groove formed at block 1220 can be implemented using the various examples described herein.

In a first example, an apparatus comprises: a semiconductor device; a metal leadframe structure having a signal lead that is electrically coupled with the semiconductor device; a molding compound encapsulating at least a portion of the semiconductor device and at least a portion of the metal leadframe structure, at least a portion of the signal lead being exposed outside the molding compound, the molding compound defining a primary plane of the apparatus; and a solder plating disposed on exposed portions of the metal leadframe structure. A flank of the signal lead having a surface area, a first portion of the surface area of the flank of the signal lead being defined by the solder plating, and a second portion of the surface area of the flank of the signal lead being defined by exposed metal of the metal leadframe structure, a center portion of the surface of the exposed metal having a height along an axis that is approximately orthogonal with the primary plane of the apparatus, the height of the center portion being greater than a height, along the axis that is approximately orthogonal with the primary plane of the apparatus, of a portion of the surface of the exposed metal that is laterally disposed from the center portion of the surface of the exposed metal.

In a second example based on the first example, a perimeter of the surface of the exposed metal has at least one curved edge.

In a third example based on any one of the previous examples, a perimeter of the surface of the exposed metal is semicircle shaped.

In a fourth example based on any one of the previous examples, the surface of the exposed metal is surrounded by the solder plating.

In a fifth example, an apparatus comprises: a semiconductor device; a metal leadframe structure having a signal lead that is electrically coupled with the semiconductor device; a molding compound encapsulating at least a portion of the semiconductor device and at least a portion of the metal leadframe structure, at least a portion of the signal lead being exposed outside the molding compound; and a solder plating disposed on exposed portions of the metal leadframe structure. A flank of the signal lead having a surface area, at least 75% of the surface area of the flank of the signal lead being defined by the solder plating, and 25% or less of the surface area of the flank of the signal lead being defined by exposed metal of the metal leadframe structure, a perimeter of a surface of the exposed metal having at least one curved edge.

In a sixth example based on the fifth example, the flank of the signal lead is disposed at an end of the signal lead, the surface area of the flank having a first portion and a second portion, the first portion being defined by a laser groove, the second portion being defined by a cleave in the metal leadframe structure, the surface of the exposed metal being included in the second portion.

In a seventh example based on the fifth example, the flank of the signal lead is disposed at an end of the signal lead, the surface area of the flank having a first portion and a second portion, the first portion being defined by a laser groove, the second portion being defined by a saw cut in the metal leadframe structure, the surface of the exposed metal being included in the second portion.

In an eighth example based on any of the fifth through seventh examples, the molding compound defines a primary plane of the apparatus, a center portion of the cross-sectional profile of the surface of the exposed metal having a height along an axis that is approximately orthogonal to the primary plane of the apparatus, the height of the center portion being greater than a height of a portion of the cross-sectional profile of the surface of the exposed metal that is laterally disposed from the center portion.

In a ninth example based on any of the fifth through eighth examples, the perimeter of the surface of the exposed metal is crescent shaped.

In a tenth example based on any of the fifth through eighth examples, the perimeter of the surface of the exposed metal is semicircle shaped.

In an eleventh example based on any of the fifth through tenth examples, the portion of the signal lead that is exposed outside the molding compound extends away from a surface of the molding compound, such that the flank of the signal lead is spaced a distance from the surface of the molding compound.

In a twelfth example based on any of the fifth and seventh through tenth examples, the flank of the signal lead is substantially coplanar with a surface of the molding compound.

In a thirteenth example, a method comprises: providing an encapsulated semiconductor device including a semiconductor die, a molding compound and a metal leadframe structure, the metal leadframe structure including a signal lead segment, the signal lead segment being electrically coupled with the semiconductor die; forming, with a laser, a groove in the signal lead segment; solder plating, including the groove, the signal lead segment; and separating, at the groove, a first portion of the signal lead segment from a second portion of the signal lead segment.

In a fourteenth example based on the thirteenth example, separating the first portion of the signal lead segment from the second portion of the signal lead segment includes performing a saw singulation of the encapsulated semiconductor device.

In a fifteenth example based on the thirteenth example, separating the first portion of the signal lead segment from the second portion of the signal lead segment includes performing a punch singulation of the encapsulated semiconductor device.

In a sixteenth example based on any of the thirteenth through fifteenth examples, forming the groove in the signal lead segment includes forming a symmetric groove.

In a seventeenth example based on any of the thirteenth through fifteenth examples, forming the groove in the signal lead segment includes forming an asymmetric groove.

In an eighteenth example based on any of the thirteenth through seventeenth examples, separating the first portion of the signal lead segment from the second portion of the signal lead segment exposes metal of the metal leadframe structure through the solder plating.

In a nineteenth example based on any of the thirteenth, fourteenth and sixteenth through eighteenth examples, the encapsulated semiconductor device is included in a panel of a plurality of encapsulated semiconductor devices formed using a single molding cavity.

In a twentieth example based on any of the thirteenth through nineteenth examples, wherein the encapsulated semiconductor device is included in a matrix of a plurality of encapsulated semiconductor devices formed using a plurality of respective molding cavities.

In a twenty-first example, an apparatus can include a semiconductor device and a metal leadframe structure having a signal lead that is electrically coupled with the semiconductor device. The apparatus can include a molding compound encapsulating at least a portion of the semiconductor device and at least a portion of the metal leadframe structure. At least a portion of the signal lead can be exposed outside the molding compound. That apparatus can include a solder plating disposed on exposed portions of the metal leadframe structure and a flank of the signal lead having a surface area. At least 75% of the surface area of the flank of the signal lead can be defined by the solder plating, and 25% or less of the surface area of the flank of the signal lead can be defined by exposed metal of the metal leadframe structure. The surface area of the flank can be a discontinuous surface area. A perimeter of a surface of the exposed metal can be crescent shaped or semicircular shaped. A center portion of the surface of the exposed metal can have a height along an axis that is approximately orthogonal with a primary plane of the apparatus. The primary plane of the apparatus can be defined by the molding compound. The height of the center portion can be greater than a height, along the axis that is approximately orthogonal with the primary plane of the apparatus, of a portion of the surface of the exposed metal that is laterally disposed from the center portion of the surface of the exposed metal.

In a twenty-second example based on the twenty-first example, the flank of the signal lead can be disposed at an end of the signal lead. The discontinuous surface area of the flank can include a first portion and a second portion. The first portion can be defined by a laser groove. The second portion can be defined by a cleave in the metal leadframe structure. The surface of the exposed metal can be included in the second portion.

In a twenty-third example based on the twenty-second example, the discontinuous surface area of the flank can further include a third portion disposed between the first portion of the discontinuous surface area of the flank and the second portion of the discontinuous surface area of the flank.

In a twenty-fourth example based on the twenty-first example, the flank of the signal lead can be disposed at an end of the signal lead. The discontinuous surface area of the flank can have a first portion and a second portion. The first portion can be defined by a laser groove. The second portion can be defined by a saw cut in the metal leadframe structure. The surface of the exposed metal can be included in the second portion.

In a twenty-fifth example based on the twenty-fourth example, the discontinuous surface area of the flank can further include a third portion disposed between the first portion of the discontinuous surface area of the flank and the second portion of the discontinuous surface area of the flank.

In a twenty-sixth example based on any of the twenty-first through twenty-fifth examples, the portion of the signal lead that is exposed outside the molding compound can extend away from a surface of the molding compound, such that the flank of the signal lead is spaced a distance from the surface of the molding compound.

In a twenty-seventh example based on any of the twenty-first through twenty-fifth examples, the flank of the signal lead can be substantially coplanar with a surface of the molding compound.

In a twenty-eighth example based on any of the twenty-first through twenty-seventh examples, the surface of the exposed metal can be surrounded by the solder plating.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor device processing techniques associated with semiconductor substrates including, but not limited to, for example, Silicon (Si), Galium Arsenide (GaAs), Galium Nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A method of producing a packaged semiconductor device, the method comprising:
    coupling a semiconductor device to a metal leadframe structure, the metal leadframe structure having a signal lead that is electrically coupled with the semiconductor device;
    forming, with a laser, a groove in the signal lead, the groove having a first sidewall and a second sidewall;
    applying solder plating to the signal lead, including the first sidewall and the second sidewall of the groove; and
    separating, at the groove, the signal lead into a first portion and a second portion, such that the second portion of the signal lead is separated from the metal leadframe structure,
    the separating the signal lead defining a signal lead flank on an end of the first portion of the signal lead, the signal lead flank having a surface area, a first portion of the surface area of the signal lead flank being defined by the solder plating, and a second portion of the surface area of the flank of the signal lead being defined by exposed metal of the metal leadframe structure.

2. The method of claim 1, wherein the groove is a V-shaped groove.

3. The method of claim 2, wherein the separating the signal lead includes separating the signal lead at a bottom of the V-shaped groove.

4. The method of claim 1, wherein the groove further includes a bottom surface disposed between the first sidewall and the second sidewall, the first sidewall having a first slope with respect to the bottom surface, and the second sidewall having a second slope with respect to the bottom surface, the second slope being different than the first slope.

5. The method of claim 1, wherein the groove further includes a bottom surface disposed between the first sidewall and the second sidewall, the first sidewall and the second sidewall having a same slope with respect to the bottom surface.

6. The method of claim 1, wherein:
    the groove further includes a bottom surface disposed between the first sidewall and the second sidewall;
    forming the groove includes forming a notch in the bottom surface, the notch being adjacent to the first sidewall; and
    the separating the signal lead includes separating the signal lead at the notch.

7. The method of claim 1, wherein:
    the groove further includes a bottom surface disposed between the first sidewall and the second sidewall;
    forming the groove includes:
        forming a first notch in the bottom surface, the first notch being adjacent to the first sidewall; and
        forming a second notch in the bottom surface, the second notch being adjacent to the second sidewall; and
    the separating the signal lead includes separating the signal lead at the first notch and at the second notch.

8. The method of claim 1, further comprising, prior to forming the groove in the signal lead, encapsulating at least a portion of the semiconductor device and at least a portion of the metal leadframe structure in a molding compound, such that a segment of the signal lead is exposed outside the molding compound, as surface of the molding compound defining a primary plane of the packaged semiconductor device.

9. The method of claim 8, wherein a center portion of the surface of the exposed metal has a height along an axis that is approximately orthogonal with the primary plane of the packaged semiconductor device, the height of the center portion being greater than a height, along the axis that is approximately orthogonal with the primary plane of the packaged semiconductor device, of a portion of the surface of the exposed metal that is laterally disposed from the center portion of the surface of the exposed metal.

10. The method of claim 1, wherein a perimeter of the exposed metal has at least one curved edge.

11. The method of claim 1, wherein a perimeter of the exposed metal is semicircle shaped.

12. The method of claim 1, wherein the exposed metal is surrounded by the solder plating.

13. A method of producing a packaged semiconductor device, the method comprising:
    coupling a semiconductor device to a metal leadframe structure, the metal leadframe structure having a signal lead that is electrically coupled with the semiconductor device;
    encapsulating at least a portion of the semiconductor device and at least a portion of the metal leadframe structure in a molding compound, a segment of the signal lead being exposed outside the molding compound;
    forming, with a laser, a groove in the segment of the signal lead, the groove having a first sidewall, a second sidewall, and a bottom surface disposed between the first sidewall and the second sidewall;
    applying solder plating to the segment of the signal lead, including the first sidewall, the second sidewall, and the bottom surface of the groove; and
    separating, at the groove, the segment of the signal lead into a first portion and a second portion, such that the second portion of the segment of the signal lead is separated from the metal leadframe structure,
    the separating the segment of the signal lead defines a signal lead flank on an end of the first portion of the segment of the signal lead, the signal lead flank having a surface area, a first portion of the surface area of the signal lead flank being defined by the solder plating, and a second portion of the surface area of the flank of the signal lead being defined by exposed metal of the metal leadframe structure.

14. The method of claim 13, wherein the first sidewall has a first slope with respect to the bottom surface, and the second sidewall has a second slope with respect to the bottom surface, the second slope being different than the first slope.

15. The method of claim 13, wherein the first sidewall and the second sidewall have a same slope with respect to the bottom surface.

16. The method of claim 13, wherein:
forming the groove includes forming a notch in the bottom surface, the notch being adjacent to the first sidewall; and
the separating the signal lead includes separating the segment of the signal lead at the notch.

17. The method of claim 13, wherein:
forming the groove includes:
  forming a first notch in the bottom surface, the first notch being adjacent to the first sidewall; and
  forming a second notch in the bottom surface, the second notch being adjacent to the second sidewall; and
the separating the signal lead includes separating the segment of the signal lead at the first notch and at the second notch.

18. A method of producing a packaged semiconductor device, the method comprising:
coupling a semiconductor device to a metal leadframe structure, the metal leadframe structure having a signal lead that is electrically coupled with the semiconductor device;
encapsulating at least a portion of the semiconductor device and at least a portion of the metal leadframe structure in a molding compound, a segment of the signal lead being exposed outside the molding compound;
forming, with a laser, a V-shaped groove in the segment of the signal lead;
applying solder plating to the segment of the signal lead, including the V-shaped groove; and
separating, at the V-shaped groove, the segment of the signal lead into a first portion and a second portion, such that the second portion of the segment of the signal lead is separated from the metal leadframe structure,
the separating the segment of the signal lead defines a signal lead flank on an end of the first portion of the segment of the signal lead, the signal lead flank having a surface area, a first portion of the surface area of the signal lead flank being defined by the solder plating, and a second portion of the surface area of the flank of the signal lead being defined by exposed metal of the metal leadframe structure.

19. The method of claim 18, wherein the separating the segment of the signal lead includes separating the segment of the signal lead at a bottom of the V-shaped groove.

20. The method of claim 18, wherein a perimeter of the surface of the exposed metal has at least one curved edge.

* * * * *